United States Patent
Zhu et al.

(10) Patent No.: US 9,746,361 B2
(45) Date of Patent: Aug. 29, 2017

(54) GASEOUS FLOW SENSOR AND RELATED METHOD THEREOF

(71) Applicant: University of Virginia Patent Foundation, Charlottesville, VA (US)

(72) Inventors: Jianzhong Zhu, Crozet, VA (US); Hilary Bart-Smith, Charlottesville, VA (US); Zheng Chen, Andover, KS (US)

(73) Assignee: University of Virginia Patent Foundation, Charlottesville, VA (US)

( * ) Notice: Subject to any disclaimer, the term of this patent is extended or adjusted under 35 U.S.C. 154(b) by 64 days.

(21) Appl. No.: 14/394,223

(22) PCT Filed: Apr. 11, 2013

(86) PCT No.: PCT/US2013/036109
§ 371 (c)(1),
(2) Date: Oct. 13, 2014

(87) PCT Pub. No.: WO2014/011277
PCT Pub. Date: Jan. 16, 2014

(65) Prior Publication Data
US 2015/0068299 A1    Mar. 12, 2015

Related U.S. Application Data

(60) Provisional application No. 61/622,979, filed on Apr. 11, 2012.

(51) Int. Cl.
*G01F 1/684* (2006.01)
*G01F 1/692* (2006.01)
*G01F 1/696* (2006.01)
*H05K 3/00* (2006.01)
(Continued)

(52) U.S. Cl.
CPC ............ *G01F 1/684* (2013.01); *G01F 1/6845* (2013.01); *G01F 1/692* (2013.01); *G01F 1/696* (2013.01); *G01F 15/006* (2013.01); *H05K 3/0011* (2013.01); *H05K 3/46* (2013.01); *Y10T 29/49155* (2015.01)

(58) Field of Classification Search
CPC ..................................................... G01F 1/684
See application file for complete search history.

(56) References Cited

U.S. PATENT DOCUMENTS

| | | |
|---|---|---|
| 4,914,742 A | 4/1990 | Higashi |
| 5,072,075 A | 12/1991 | Lee et al. |
| 5,484,517 A | 1/1996 | Hopson |

(Continued)

OTHER PUBLICATIONS

"European Application Serial No. 13816932.1, Extended European Search Report mailed Oct. 16, 2015", 7 pgs.
"European Application Serial No. 13816932.1, Response filed May 10, 2016 to Extended European Search Report mailed Oct. 16, 2015", 16 pgs.

(Continued)

*Primary Examiner* — Ryan Walsh
(74) *Attorney, Agent, or Firm* — Robert J. Decker

(57) ABSTRACT

A gas flow sensing device, and related method of manufacturing, comprising a conductive layer encapsulated in dielectric film, suspended over a cavity to form a diaphragm. The conductive layer functions as both a heating a sensing element and is patterned to provide uniform heat distribution across the diaphragm. The device is designed to sense flow from any direction relative to the device and the design of the dielectric film and diaphragm reduces sensor drift during prolonged operation.

57 Claims, 16 Drawing Sheets

(51) Int. Cl.
*H05K 3/46* (2006.01)
*G01F 15/00* (2006.01)

(56) References Cited

U.S. PATENT DOCUMENTS

| | | | |
|---|---|---|---|
| 5,789,020 | A | 8/1998 | Tran |
| 5,998,816 | A | 12/1999 | Nakaki |
| 6,153,360 | A | 11/2000 | Chung |
| 6,378,365 | B1* | 4/2002 | Tu .................. G01F 1/6845 73/204.26 |
| 6,762,113 | B2* | 7/2004 | Jeans ................ C09D 175/04 257/E21.259 |
| 7,357,035 | B2 | 4/2008 | Liu |
| 8,132,455 | B2 | 3/2012 | Chen |
| 8,429,964 | B2 | 4/2013 | Sakuma |
| 2002/0074314 | A1 | 6/2002 | Bohn |
| 2002/0100316 | A1* | 8/2002 | James ................ G01F 1/6845 73/204.26 |
| 2003/0092203 | A1* | 5/2003 | Murai ................ B41J 2/14233 438/3 |
| 2006/0243064 | A1* | 11/2006 | Liu .................... G01F 1/662 73/861.25 |
| 2009/0158859 | A1* | 6/2009 | Huang ................ G01F 1/6845 73/861.351 |
| 2010/0078753 | A1 | 4/2010 | Mehregany |
| 2010/0139391 | A1 | 6/2010 | Sakuma |
| 2011/0266521 | A1 | 11/2011 | Ferrari |

OTHER PUBLICATIONS

Buder, et al., "AeroMEMS Wall Hot-Wire Anemometer on Polyimide Substrate Featuring Top Side or Bottom Side Bondpads", IEEE Sensors Journal, Aug. 2007, pp. 1095-1101, vol. 7, No. 8.
Ewing, et al., "A Direct-Measurement Thin-Film Heat Flux Sensor Array", Measurement Science and Technology, 2010, 8 pages, vol. 21, No. 10, IOP Publishing Ltd.
Ganji, B. A., "Design and Fabrication of a Novel MEMS Silicon Microphone", Crystalline Silicon—Properties and Jses, Jul. 27, 2011, 16 pages, Chapter 14, http://www.intechopen.com/source/pdfs/17734/InTech-Mems_silicon_microphone.pdf.
Hopson, R., "Thin Hot-Film Sensors on Polymide Film", NASA Tech. Briefs, Mar. 1993, p. 102-103.
Kuoni, et al., "Polyimide Membrane with ZnO Piezoelectric Thin Film Pressure Transducers as a Differential Pressure Liquid Flow Sensor", Journal of Micromechanics and Microengineering, 2003, pp. S103-S107, vol. 13.
Pedersen, et al., "A Capacitive Differential Pressure Sensor with Polyimide Diaphragm", Journal of Micromechanics and Microengineering, 1997, pp. 250-252, vol. 7.
Stemme, G., "A Monolithic Gas Flow Sensor with Polyimide as Thermal Insulator", IEEE Transactions on Electron Devices, Oct. 1986, pp. 1470-1474, vol. ED-33, No. 10.
Wei, et al., "Hybrid System for Airspeed Measurement using Dual MEMS Sensors", Proceedings of the 2011 fifth IEEE International Conference on Nano/Micro Engineered and Molecular Systems, Feb. 20-23, 2011, pp. 1224-1228, Kaohsiung, Taiwan.

* cited by examiner

GASEOUS FLOW SENSOR AND RELATED METHOD THEREOF

CROSS REFERENCE TO RELATED APPLICATIONS

The present application is a national stage filing International Application No. PCT/US2013/036109, filed Apr. 11, 2013, which claims priority under 35 U.S.C. §119(e) from U.S. Provisional Application Ser. No. 61/622,979, filed Apr. 11, 2012, entitled "Flow Sensor and Methods of Use and Fabrication of the Same;" the disclosures of which are hereby incorporated by reference herein in their entirety.

STATEMENT OF GOVERNMENT INTEREST

This invention was made with government support under Grant No. N00014-08-1-0642, awarded by the Office of Naval Research. The government has certain rights in the invention.

FIELD OF THE INVENTION

The present invention relates generally to the field of sensors. More specifically, the invention relates to the subfield of gaseous flow sensors.

BACKGROUND OF THE INVENTION

There have been developments in Micro-Electro-Mechanical Systems (MEMS) and microfabrication technology, which facilitates the measurement of flow rate with a miniature chip.

For one type of thermal flow sensor, it measures the effect of the moving fluid on a hot film, either through measuring the temperature change under constant heating power or monitoring the heating power adjustment for maintaining constant temperature. This type of thermal flow sensor is called a hot-wire or a hot-film sensor. For another type of thermal flow sensor, it measures the asymmetry of a temperature profile across the hot film due to the moving fluid. This type of thermal flow sensor is called a calorimetric sensor. For yet another type of thermal flow sensor, it measures the dynamic of a heat pulse passing through different locations of a hot film. This type of thermal flow sensor is called a time-of-flight sensor.

One of the components of a thermal flow sensor is the microfabricated freestanding sensing element. Heat loss from the associated heating element to the substrate during operation causes long-term sensor drift. However, to date, the problem of long-term operation sensor drift caused by heat loss has not been solved, much less for commercially available flow sensors.

SUMMARY OF THE INVENTION

An aspect of an embodiment of the present invention provides gas flow sensing device, and related method of manufacturing, comprising a conductive layer encapsulated in dielectric film, suspended over a cavity to form a diaphragm. The conductive layer functions as both a heating a sensing element and is patterned to provide uniform heat distribution across the diaphragm. The device is designed to sense flow from any direction relative to the device and the design of the dielectric film and diaphragm reduces sensor drift during prolonged operation. The device is designed to sense flow from any in-plane gas flow from any arbitrary direction.

An aspect of an embodiment of the present invention provides a low power electronic sensing device for use measuring gaseous flow. The device may comprise: a dielectric layer with a first surface in communication with a flow to be measured; a substrate in communication with a second surface of the dielectric layer; a cavity in the substrate, wherein a portion of the dielectric layer being substantially in communication with the cavity to form a diaphragm; and a conductive layer disposed on or inside the diaphragm.

An aspect of an embodiment of the present invention provides a method for manufacturing a low power electronic sensing device for use measuring gaseous flow. The method may comprise: providing a substrate (16 or 310) having a first side and a second side; applying a first dielectric layer in communication with the substrate; applying a conductive layer in communication with the first dielectric layer; applying a second dielectric layer (102 or 360) in communication with the first dielectric layer and the conductive layer; and creating a cavity in the substrate in communication with the first dielectric layer to form a diaphragm.

These and other advantages and features of the invention disclosed herein, will be made more apparent from the description, drawings and claims that follow.

DESCRIPTION OF THE DRAWINGS

The accompanying drawings, which are incorporated into and form a part of the instant specification, illustrate several aspects and embodiments of the present invention and, together with the description herein, serve to explain the principles of the invention. The drawings are provided only for the purpose of illustrating select embodiments of the invention and are not to be construed as limiting the invention.

FIG. 1(A) provides a sectional view of cross section A-A shown in the elevation view of FIG. 1(B). FIG. 1(A) illustrates a conductive layer disposed between dielectric layers and suspended over a cavity to form a diaphragm.

FIG. 2(A) initial application of a dielectric layer with a conductive layer patterned inside a photoresist layer; FIG. 2(B) application of a second dielectric layer; FIG. 2(C) exposure of contact pads on the front side of the device with a cavity on the back side of the device defined by a photoresist layer patterned to the shape of that cavity, and FIG. 2(D) the final functioning device with diaphragm.

DETAILED DESCRIPTION OF EXEMPLARY EMBODIMENTS OF THE INVENTION

Figure 1:
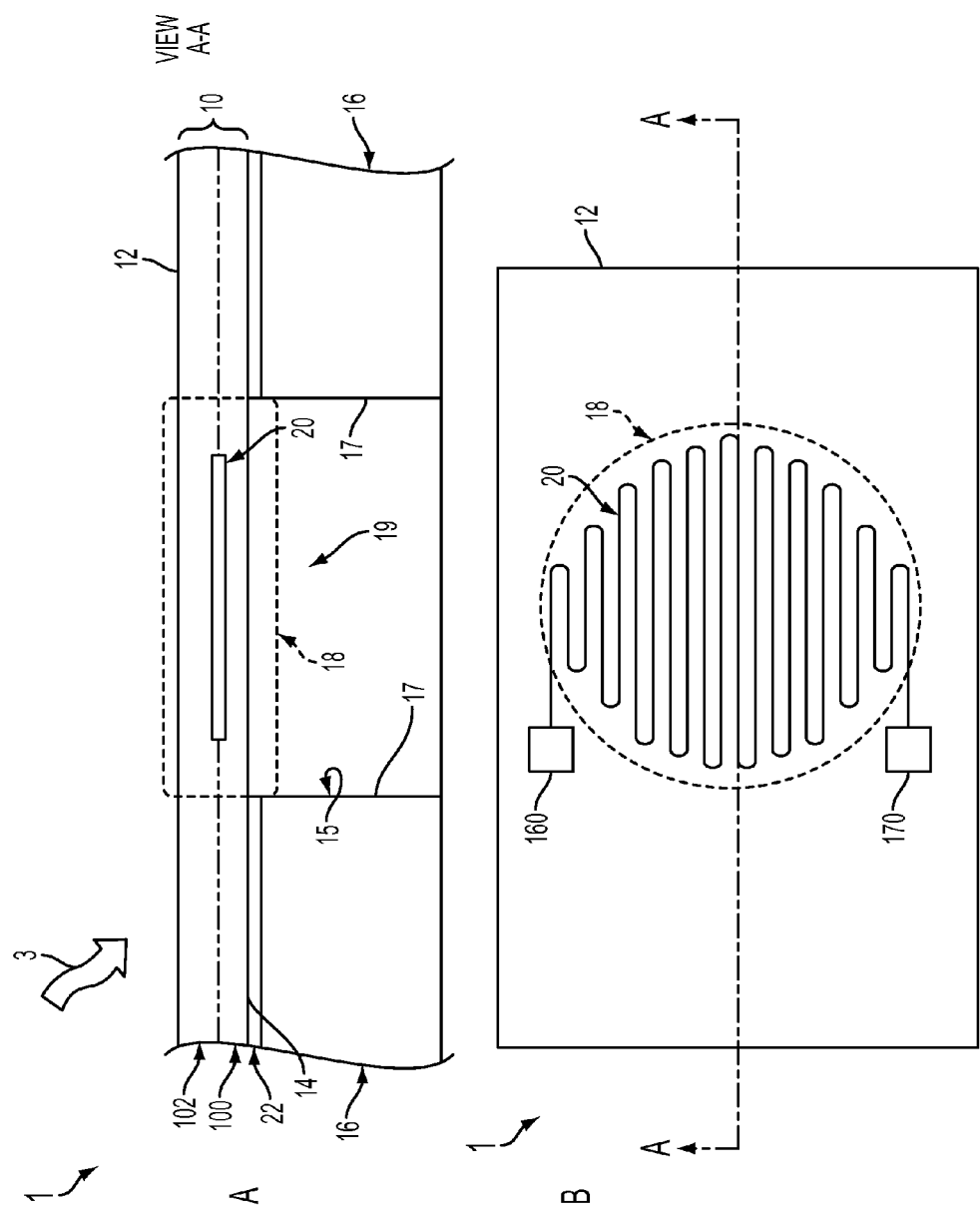
FIGS. 1(A) and 1(B) provide schematic illustrations of the assembled device.

FIGS. 1(A) and 1(B) provide schematic illustrations of an embodiment of the sensing device 1. The device is used to sense gaseous flow 3. FIG. 1(A) provides a sectional view of cross section A-A shown in the elevation view of FIG. 1(B). FIG. 1(A) illustrates a conductive layer 20 in communication with a dielectric layer 10 and suspended over a cavity 15 to form a diaphragm 18. The dielectric layer 10 is in communication with a substrate 16. One embodiment of the invention includes a porous-silicon mating surface 22 between the second surface 14 of the dielectric layer 10 and the substrate 16 to increase the bond strength between the dielectric layer 10 and the substrate 16. It should be appreciated that various mechanical bonding approaches may be implemented as desired or required. Alternatively, a promoter such as VM-652 from DUPONT, or a similar promoter as well as other available types of promoters as desired, needed or required, may be used between the dielectric film 10 and the substrate 16. Other promoters comprising of organosilane may be implemented within the context of the invention. The substrate 16 can be any material, but is most commonly mono-crystalline silicon. The cavity 15 in the substrate 16 and the porous silicon mating surface 22, if present, is defined by the cavity wall 17. The diaphragm 18 is formed where the dielectric layer 10 is suspended over the cavity 15. In one embodiment of the invention, a conductive layer 20 is disposed between a first dielectric layer 100 of the dielectric layer 10 and second dielectric layer 102 of dielectric layer 10.

Referring to FIG. 1(B), an elevation view of the device is shown. FIG. 1(B) illustrates electrical contact pads 160, 170 connected by a conductive layer 20. The conductive layer 20 is patterned to create a substantially uniform heat distribution across the diaphragm 18. For example, a uniform heat distribution can be characterized as one having an absence of hot spots while striving to maintain a substantially even distribution of heat across the diaphragm. In one embodiment of the invention, the diaphragm 18 is circular.

Referring to FIG. 1(A) and FIG. 1(B) the conductive layer 20, it is heated as a current passes through it. As the temperature of the conductive layer 20 changes, its resistance also changes and this change in resistance can be measured. For a given current, the conductive layer 20 will achieve steady state temperature when not in communication with a gaseous flow 3. When a gaseous flow 3 communicates with the first surface 12 of the dielectric layer 10, the conductive layer 20 is cooled relative to the magnitude of the gaseous flow 3. The presence and magnitude of this gaseous flow 3 can be measured relative to the change in the resistance of the conductive layer 20.

Still referring to FIG. 1(A) and FIG. 1(B), in one embodiment of the invention, the dielectric layer 10 is made from polyimide. Polyimide exhibits very low thermal conductivity and greatly reduces the heat loss from the conductive layer 20 into the substrate 16 when compared with a dielectric layer 10 made from silicon nitride. It is appreciated that any dielectric material with low thermal conductivity may be used. By using a material with a very low thermal conductivity like polyimide, the device 1 experiences low levels of sensor drift during long periods of operation because very little heat is transferred from the conductive layer 20 to the substrate 16. The dielectric layer 10 may be comprised of two layers, a first dielectric layer 100 in communication with a substrate 16 and a second dielectric layer 102 in communication with a gaseous flow 3 when present.

Figure 2:
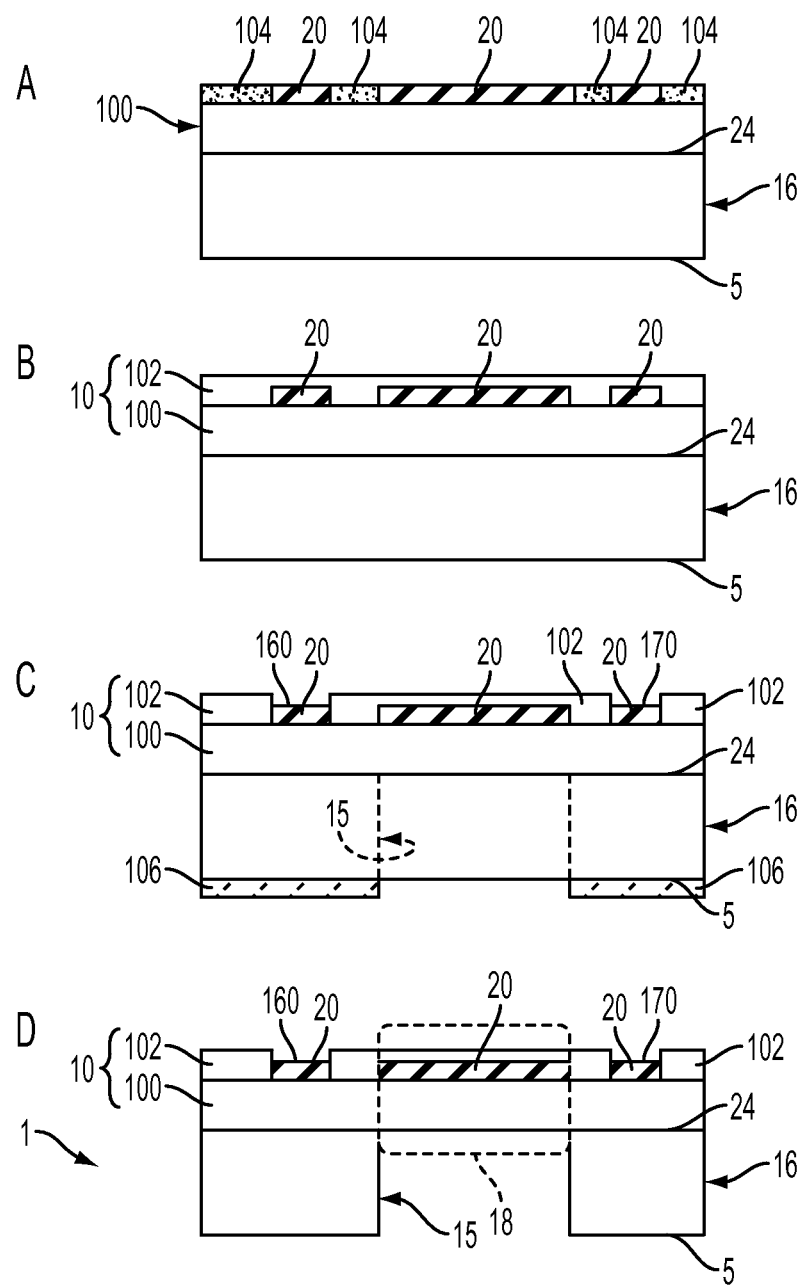
FIGS. 2(A) through 2(D) provide sectional drawings which illustrate a general overview of the manufacturing process of the present invention sensing device, illustrating four main steps including.

FIGS. 2(A) through 2(D) provide sectional drawings which illustrate a general overview of the manufacturing process of the present invention sensing device 1, illustrating four main steps including FIG. 2(A) initial application of a first dielectric layer 100 on the first side 24 of the rigid substrate 16 with a conductive layer 20 patterned inside a first photoresist layer 104; FIG. 2(B) application of a second dielectric layer 102 to form the dielectric layer 10; FIG. 2(C) exposure of contact pads 160, 170 on the front side of the device with a cavity 15 on the back side of the device defined by a second photoresist layer 106 patterned to the shape of that cavity 15, and; FIG. 2(D) the final functioning device 1 with diaphragm 18. It should also be appreciated that the use of term of "front side" and any other directional cues used herein, such as "back side," are meant merely to convey the relative positions of the layers or components rather than limiting any embodiment of the invention to any particular orientation.

Figure 3:
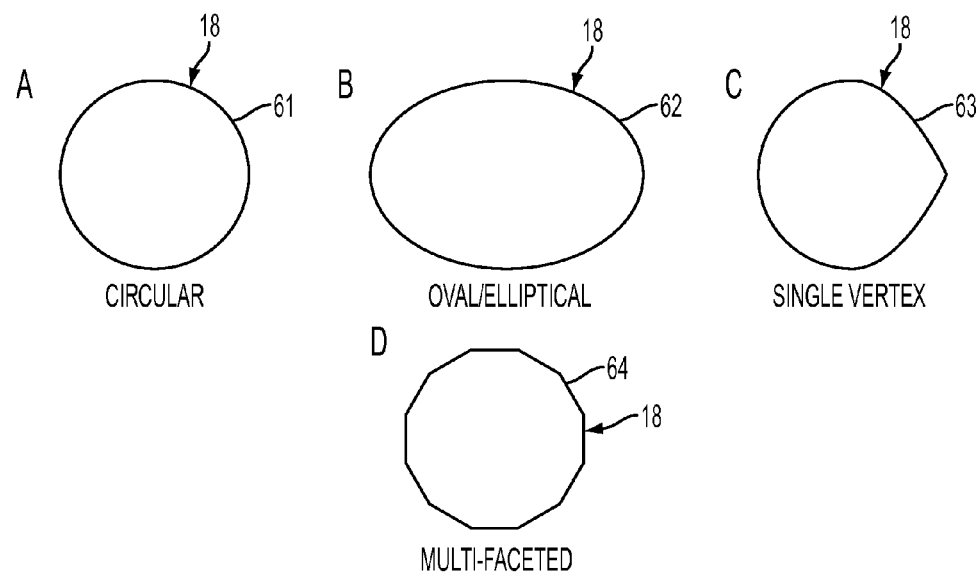
FIG. 3 provides schematic illustrations of exemplary embodiments of the shape of the diaphragm.

FIG. 3 provides schematic illustrations of embodiments of the shape of the diaphragm 18. As illustrated in FIG. 3, embodiments of the diaphragm 18 may take many forms and the present invention is not limited to the embodiments shown in FIG. 3. FIG. 3(A) illustrates diaphragm 18 as a circular diaphragm 61. The circular diaphragm 61 is optimal due to the ability to consistently sense flow from any direction. The other embodiments of the diaphragm 18 include oval/elliptical 62, single vertex 63, and multi-faceted 64, shown in FIGS. 3(B), 3(C), and 3(D) respectively, can be expected to sense flow from any direction as well; however, they may lack the precision of the circular diaphragm 61. It is understood that a device with a circular diaphragm 61 or a near-circular diaphragm will not require directional calibration as it will sense gaseous flow 3 from one direction across its surface the same as it would a sense a gaseous flow 3 from any other direction across its surface. In an example, it should be appreciated that since the shape of the conductive layer 20 is circular and the temperature distribution over the conductive layer 20 is uniform, any in-plane gas flow from any arbitrary direction takes a same amount of heat from the sensing element and causes a similar cooling effect. This provides for gas flow sensing, which is directionless.

Additionally, it should be appreciated that for an embodiment of the sensor device having an axisymmetric or near axisymmetric configuration then the sensor device is not orientation sensitive. It should be appreciated that the sensing device may also be calibrated to sense out-of-plane gas flows. Gas flow from any direction may be measured so long as the flow comes into contact with the sensing device.

While the diaphragm 18 as shown in FIG. 1(A) and FIG. 1(B) is unsupported across the cavity 15 without proximal structures, it is appreciated that the diaphragm 18 may be supported intermittently with one or more supporting structures across the cavity 15 or filled with other types of structures or materials. These supports (although not shown) or other types of structures or materials (although not shown) may take the form of columns, lattices, films, layers, porous material, or other structure known in the art to support or strengthen the diaphragm 18 or for other uses as needed, required or desired. In general, any of these structures or materials will be considered ancillary structures 19 as generally referenced for general location in the drawing. It should be appreciated that the cavity 15 is provided to achieve extremely low thermal conductivity, as well as promote low sensor drift. For instance, in an embodiment the large air gap formed by the cavity 15 provides superior insulation. In an embodiment for example the cavity 15 could include a Polyimide material or other low thermal conductivity materials (or structures) as desired, required, or needed. In various embodiments the area of the cavity 15 may include a variety of design materials and structures to achieve very low thermal conductivity and promote low sensor drift.

Figure 4:
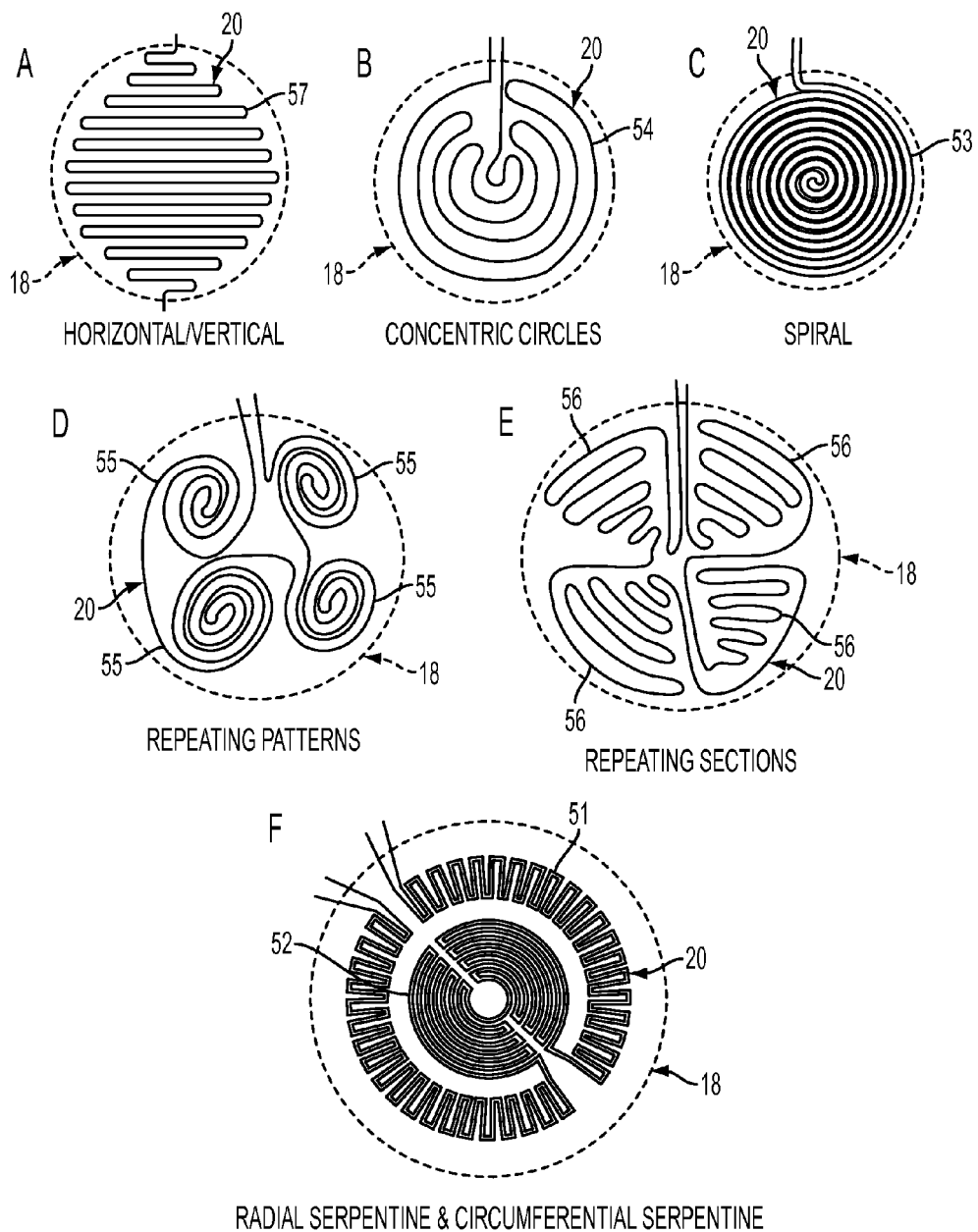
FIG. 4 provides schematic illustrations of exemplary embodiments of the conductive layer pattern.

Referring now to FIG. 4, which provides schematic illustrations of embodiments of various patterns of the conductive layer 20. The purpose of the pattern of the conductive layer 20 is to heat the diaphragm 18 evenly. By uniformly heating the diaphragm 18, the device 1 is able to consistently sense flow from any direction. The patterns are provided so as to provide a uniform heat distribution that also gives a desired resistance. In an approach the length of a coil may be about 30 mm. In many applications, the length of the coil patterned into the conductive layer 20 will fall within the range of 25 mm to 35 mm. It should be appreciated that it may be longer or shorter as desired, needed or required. A long coil patterned into the conductive layer 20 is preferred over a shorter coil patterned into the conductive layer 20 because a small change in resistance is more easily measured in a conductive layer 20 with a higher overall value of resistance. FIG. 4(A) illustrates an embodiment of the invention where the conductive layer 20 is patterned with horizontal or vertical lines 57. FIG. 4(B) illustrates an embodiment of the invention where the conductive layer 20 is patterned with concentric circles 54. FIG. 4(C) illustrates an embodiment of the invention where the conductive layer 20 is patterned with one or more spirals 55. FIG. 4(D) illustrates an embodiment of the invention where the conductive layer 20 is patterned with a repeating pattern of the spiral 55. FIG. 4(E) illustrates an embodiment of the invention where the conductive layer 20 is patterned with a repeating section 56. Neither the repeating pattern of the spirals 55 nor the repeating section 56 is limited to the specific pattern or section shown, one skilled in the art will be aware that there are a great variety of patterns and sections that could evenly heat the diaphragm 18. For instance, it should be appreciated that adequately dense axisymmetric patterns, or patterns approaching axial-symmetry, demonstrate uniform heat distribution. FIG. 4(F) illustrates an embodiment of the invention where the conductive film 20 is patterned in a radial serpentine pattern 51 creating an arc concentric with a circumferential serpentine pattern 52. In an approach, the gaps between the individual lines of the conductive layer 20 may be only about 3-5 microns. It should be appreciated that the gaps between the lines may be wider or narrower as desired, needed or required. In some applications, gaps between individual lines of the conductive layer 20 may be larger than 5 microns for considerations of cost. However, while there is no express upper limit to the gap between individual lines of the conductive layer 20, most applications will benefit from gaps which are no larger than 20 microns.

Figure 5:
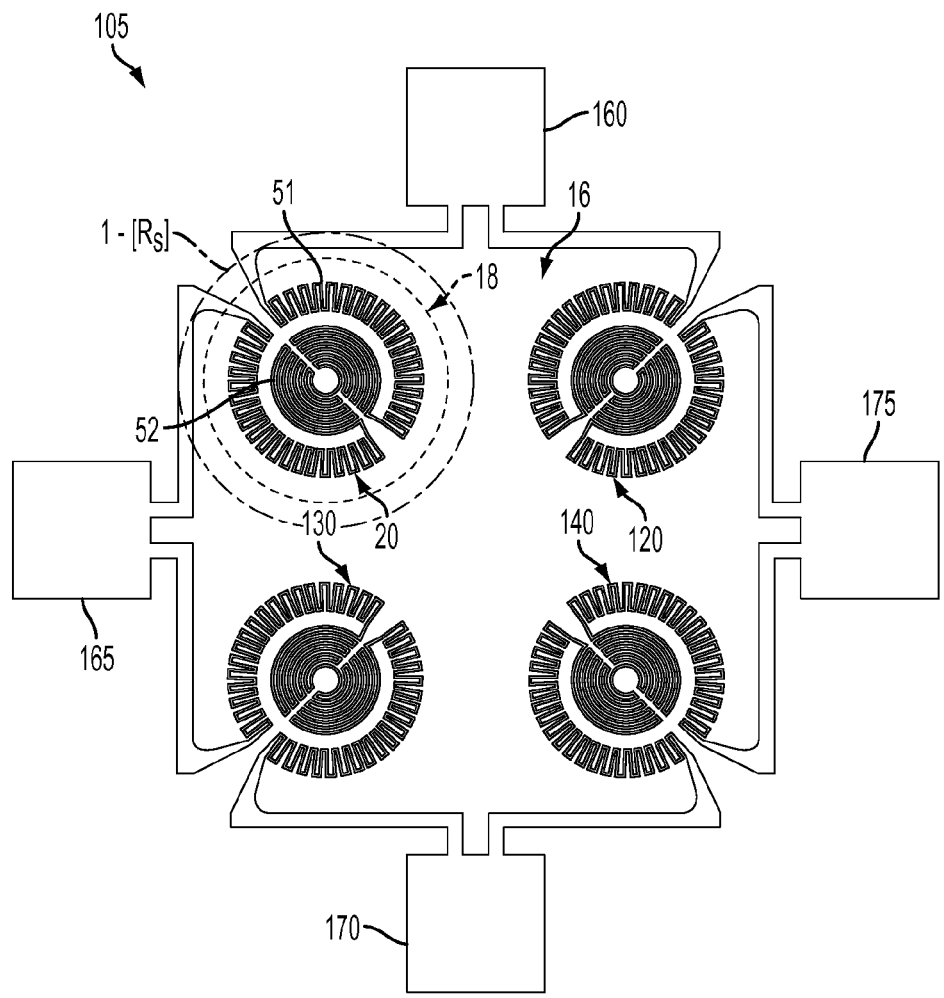
FIG. 5 provides a schematic illustration of an embodiment of the sensing device incorporated into a Wheatstone bridge.
Figure 6:
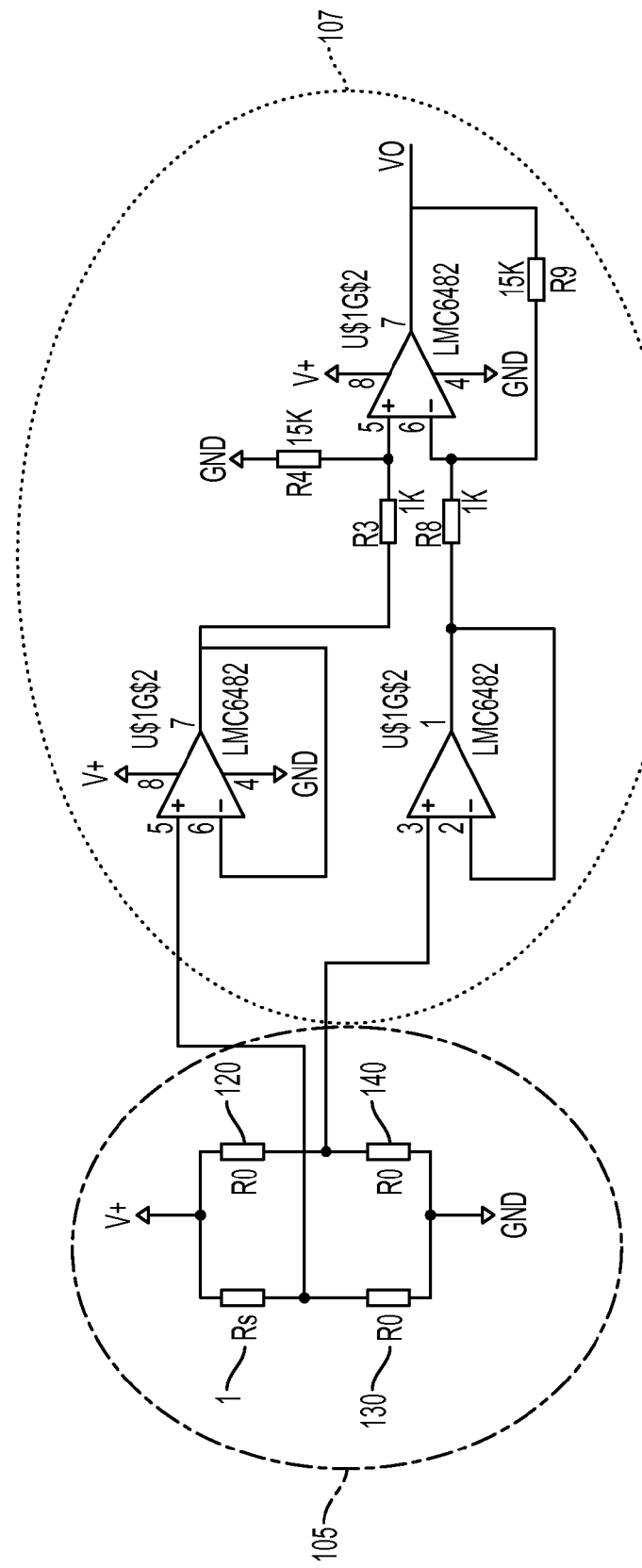
FIG. 6 provides a schematic illustration of the amplifier circuit to be used in conjunction with the present invention sensing device.

Referring now to FIG. 5, which provides a schematic illustration of an embodiment of the sensing device 1 incorporated into a Wheatstone bridge 105 (or equivalent or similar circuitry available as desired, needed or required). The sensing resistor device 1 is shown in communication with a diaphragm 18. The conductive layer 20 in the sensing resistor (Rs) device 1 is patterned in a radial serpentine pattern 51 creating an arc concentric with a circumferential serpentine pattern 52. The other resistors shown in FIG. 5 form a Wheatstone bridge circuit 105 configuration. These other resistors 120, 130, and 140 are disposed within a dielectric layer 10 that is bonded directly to the substrate 16. Four electrical contact pads 160, 165, 170, and 175 are joined to the resistors 120, 130, and 140 and connected to an amplifier circuit 107, as shown in FIG. 6. It is understood in the art that the amplifier circuit 107 could be integrated with the sensing resistor (Rs) device 1 into a single chip or fabricated out of discrete components. FIG. 6 provides a schematic illustration of the amplifier circuit 107 to be used in conjunction with the Wheatstone bridge 105, which includes the sensing device 1.

Figure 7A:
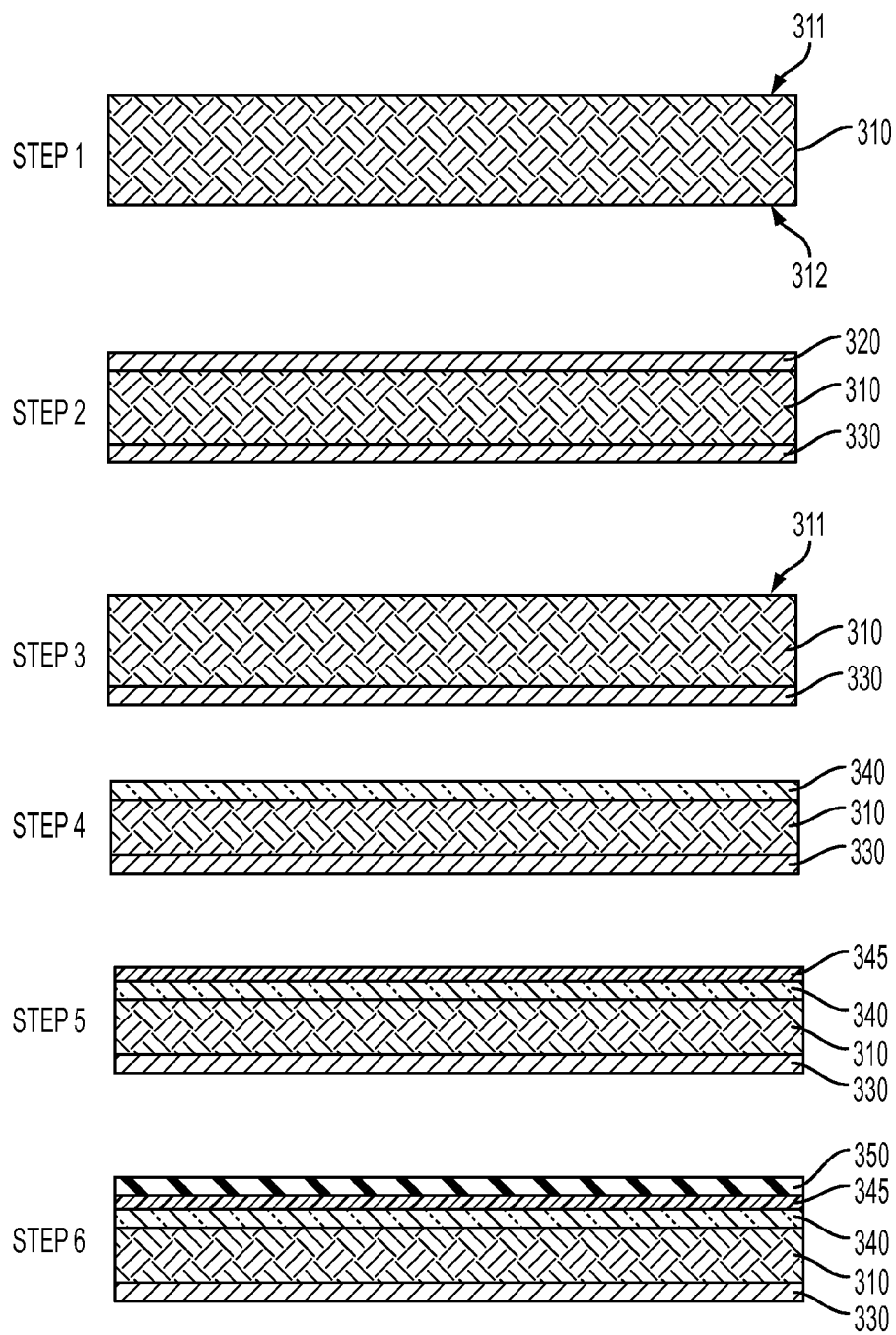
FIGS. 7(A), 7(B), and 7(C) provide detailed sectional schematic illustrations of the step-by-step manufacturing process of an embodiment of the present invention sensing device.
Figure 7B:
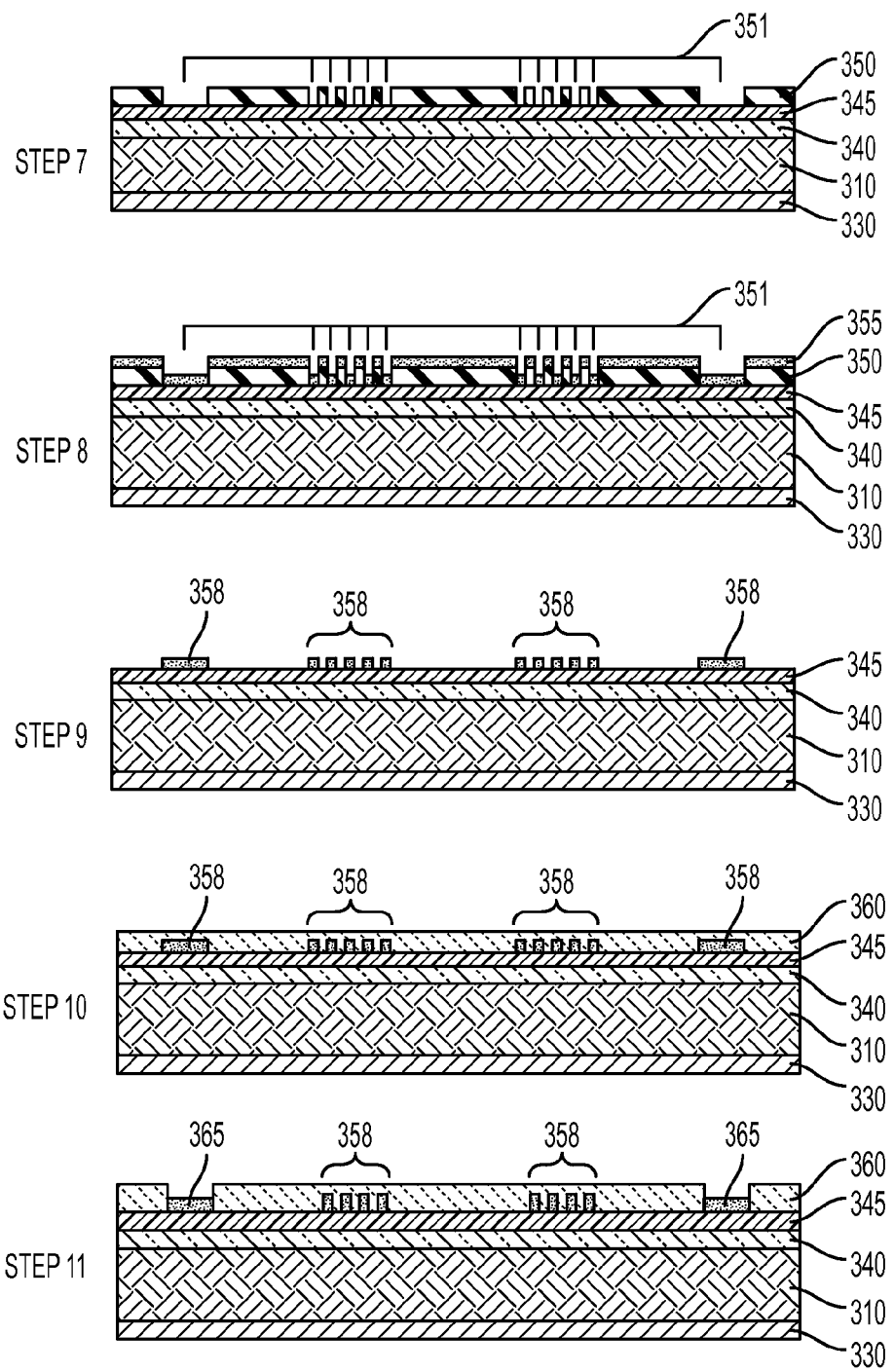
Figure 7C:
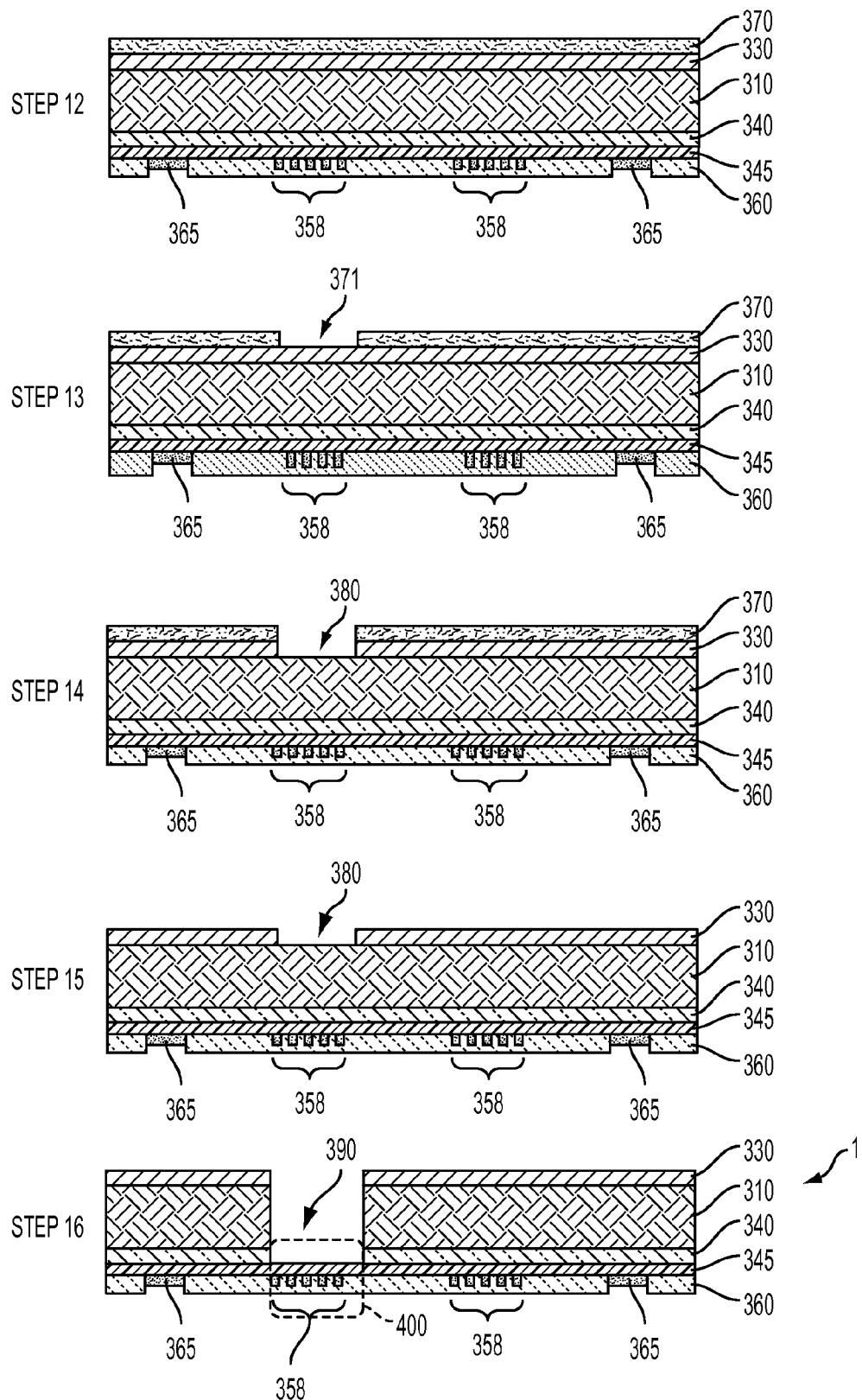

FIGS. 7(A), 7(B), and 7(C) provide detailed sectional drawings of the steps of the fabrication of an embodiment of the present invention sensing device 1. First, in STEP 1 a substrate 310 may be procured to serve as the base structure of the sensing device. This substrate 310 may be any material that satisfies the necessary requirements of providing a base on which the rest of the sensor may be supported. In one particular embodiment of the invention, the substrate 310 is a double-side polished silicon wafer, or, alternatively, monocrystalline silicon. In an approach, the substrate may be substantially rigid. A substantially rigid substrate is one that has a modulus of elasticity such that it will not appreciably deform during the normal use and function of the sensing device, i.e., a deformation that would not affect sensor readings within a desired or required range. In one approach, the deformation caused error should be less than 1% of the reading or less than a 10 mv range (I'm not sure if "10 my range" is a term of art, but I put a in front of it for flow). It should be appreciated that the percent of reading error may be less than or greater than 1% as desired, needed or required. Similarly, the 10 mv range error may be increased or decreased as desired, needed or required.

Still referring to FIG. 7(A), in STEP 2, the substrate 310 is prepared for processing by preparing the first side 311 and the second side 312 of the substrate 310 by the application of preparation layers 320 and 330. In one particular embodiment of the invention, using a double-side polished silicon wafer as the substrate 310, the first side 311 and second side 312 will have layers of silicon oxide grown on them, 320 and 330 respectively. The application of the first preparation layer 320 and second preparation layer 330 may be accomplished through any manufacturing means possible. In one particular embodiment of the invention, utilizing a substrate 310 with the first preparation layer 320 and second preparation layer 330, both composed of silicon oxide, the first preparation layer 320 and second preparation layer 330 may be grown on the substrate 310 using a wet oxidation furnace. In a particular embodiment of the invention, the first preparation layer 320 and second preparation layer 330 composed of silicon oxide will have thickness in the range of 300 nm to 600 nm.

Still referring to FIG. 7(A), in STEP 3 the first preparation layer 320 may be stripped from the substrate 310 in order to prepare the first side 311 of the substrate 310 for the future application of the first dielectric layer 345. In a particular embodiment of the invention, the first preparation layer 320 composed of silicon oxide may be removed from the substrate 310 through application of a Buffered Oxide Etch (BOE) solution.

Still referring to FIG. 7(A), in STEP 4 the substrate 310 may be prepared for the application of a first dielectric layer 345. The substrate 310 may be prepared in such a way as to ensure that the application of the first dielectric layer 345 will properly adhere to the first side 311 of the substrate 310. In one embodiment of the present invention, this preparation of the first side 311 of the substrate 310 involves creation of an attachment layer 340. This layer may be any method, chemical, promoter, or structure that will facilitate the proper adherence of a dielectric layer. In one embodiment, the attachment layer 340 may consist of a porous silicon layer on the first side 311 of the substrate 310. This attachment layer 340 of porous silicon may be created using any available method, including but not limited to electromechanical anodization, stain etching, metal assisted etching, and colloidal nanoparticle assisted etching. In another embodiment, a promoter may be used between the first side 311 of the substrate 310 and the first dielectric film 345. In one embodiment, the promoter used between the first side 311 of the substrate 310 and the first dielectric layer 345 is DUPONT VM-652.

Still referring to FIG. 7(A), in STEP 5, a first dielectric layer 345 is applied to the attachment layer 340. This first dielectric layer 345 may be composed of any material that meets the requirements of the sensing device, including but not limited to properties such as rigidity, electrical conductivity or insulation, thermal conductivity or insulation, mechanical strength, or useable temperature range. Furthermore, the first dielectric layer 345 may be applied through any process that will lay down the layer in the thickness required by the particular application of the present invention. In one particular embodiment of the device, the first dielectric layer 345 may be composed of polyimide that is applied through a spin coating process. Using a spin coating process, this first dielectric layer 345 of polyimide may be applied in a thickness of 2-3 micrometers.

After the application of the first dielectric layer 345, the device should be subjected to a first cure process to set the first dielectric layer 345 onto the attachment layer 340. It should be appreciated that this heating process may be carried out in a number of ways using a variety of heating methods including thermal, radiant, or other heat sources. The curing time and temperature used will vary with the particular material composition and thickness of layers chosen for the particular sensor application. In one particular embodiment of the invention, the curing is accomplished through thermal heating of the device. When using a first dielectric layer 345 composed of polyimide that is approximately 2-3 micrometers thick, curing of the device at approximately 350 degrees Centigrade for approximately two hours should be sufficient to cure the polyimide.

Still referring to FIG. 7(A), in STEP 6 a first photoresist layer 350 is applied to the first dielectric layer 345. This first photoresist layer 350 may be applied in any method that achieves the desired thickness and uniformity. In one particular embodiment of the invention, the first photoresist layer 350 is applied through a spin coating method to achieve a thickness of approximately 1 micrometer.

In FIG. 7(B), in STEP 7, the first photoresist layer 350 is patterned in such a way as to create the desired pattern of wires, contact pads, and structures that are desired in the sensing device. Any method of patterning the first photoresist layer 350 that achieves the desired pattern and resolution may be employed. In one embodiment of the present invention, the first photoresist layer 350 may be patterned through lithography. The result of this patterning in the first photoresist layer 350 is the creation of voids 351 in the desired shape.

Still referring to FIG. 7(B), in STEP 8 a conductive layer 355 is applied over the first photoresist layer 350. Any method of applying the conductive layer 355 may be used which ensures that the conductive layer 355 is able to penetrate into the voids 351 and adhere to the dielectric layer 345. In one particular embodiment of the invention, the conductive layer 355, composed of platinum, may be applied through a sputter technique to achieve a conductive layer 355 approximately 100 nanometers in thickness. It should be appreciated that there are a number of materials that may constitute the conductive layer 355. These materials include but are not limited to platinum, gold, silver, copper, tungsten, nickel, aluminum, or any alloy composed of any combination thereof. In addition, other metals, alloys, organic, composite, or non-metallic materials which satisfy the requirements of the sensor application, including but not limited to material properties of density, strength, flexibility, electrical conductivity, electrical resistance, thermal conductivity, ease of manufacturing, or useable temperature range may be employed.

Still referring to FIG. 7(B), STEP 9 illustrates the removal of the first photoresist layer 350. The removal of the first photoresist layer 350 also removes the portions of the conductive layer 355 which were deposited on top of the first photoresist layer 350. The result is that only the portions of the conductive layer 355 deposited in the voids 351 remain, leaving patterned the conductive layer 358 on the surface of the first dielectric layer 345. In one embodiment of the invention, the first photoresist layer 350 may be removed through use of an acetone solvent. It should be appreciated that any method that effectively removes the first photoresist layer 350 while allowing the patterned conductive layer 358 to remain without causing damage to the sensor may be used.

Still referring to FIG. 7(B), in STEP 10 a second dielectric layer 360 is applied over the first dielectric layer 345 and the patterned conductive layer 358. The second dielectric layer 360 may be composed of any material that meets the requirements of the sensing device, including but not limited to properties such as rigidity, electrical conductivity or insulation, thermal conductivity or insulation, mechanical strength, or useable temperature range. Furthermore, the second dielectric layer 360 may be applied through any process that will lay down the layer in the thickness required by the particular application of the present invention. In one particular embodiment of the device, the second dielectric layer 360 may be composed of polyimide that is applied through a spin coating process. Using a spin coating process, this second dielectric layer 360 of polyimide may be applied in a thickness of 2-3 micrometers.

Once the second dielectric layer 360 has been applied over the first dielectric layer 345 and the patterned conductive layer 358, the device should be subjected to a second cure process to set the second dielectric layer 360. It should be appreciated that this heating process may be carried out in a number of ways using a variety of heating methods including thermal, radiant, or other heat sources. The curing time and temperature used will vary with the particular material composition and thickness of layers chosen for the particular sensor application. In one embodiment of the invention, the second curing process may take the form of a soft bake where the device is heated at approximately 100 degrees Centigrade for approximately 2 minutes, then heated at approximately 110 degrees Centigrade for approximately 2 additional minutes, then heated at approximately 130 degrees Centigrade for approximately 2 final minutes.

Still referring to FIG. 7(B), STEP 11 illustrates the exposure of the electrical contact pads 365. In order to expose the electrical contact pads 365, the second dielectric layer 360 may be patterned in such a way as to remove the second dielectric layer 360 over the electrical contact pads 365 while not removing the second dielectric layer 360 over any other portions of the sensor and the patterned conductive layer 358. It should be appreciated that any process which allows the removal of the second dielectric layer 360 over the electrical contact pads 365 while allowing the rest of the second dielectric layer 360 to remain intact is sufficient for this manufacturing process. This may include any mechanical or chemical process that is able to remove the second dielectric layer 360 in a precise manner. In one embodiment of the invention, the second dielectric layer 360 may be removed over the electrical contact pads 365 through a lithography process.

After the exposure of the electrical contact pads 365, the device should be subjected to a third cure process to set the second dielectric layer 360. It should be appreciated that this heating process may be carried out in a number of ways using a variety of heating methods including thermal, radiant, or other heat sources. The curing time and temperature used will vary with the particular material composition and thickness of layers chosen for the particular sensor application. In one particular embodiment of the invention, the curing is accomplished through thermal heating of the device. When using a second dielectric layer 360 composed of polyimide that is approximately 2-3 micrometers thick, curing of the device at approximately 350 degrees Centigrade for approximately two hours should be sufficient to cure the polyimide.

In FIG. 7(C), the device as shown in the drawings is inverted with the second side 312 of the substrate 310 shown on the top of the drawings in STEP 12 through STEP 16. This is shown for simplicity and should be in no way construed to limit the manufacturing process to any specific orientation or to require that the device be inverted at any time. It should be appreciated that all steps could be undertaken in any orientation and that inversion of the device may be useful at any stage, or at no stage at all, depending on the particular equipment used in the manufacturing process.

Still referring to FIG. 7(C), STEP 12 illustrates the application of a second photoresist layer 370 to the second preparation layer 330. This second photoresist layer 370 may be applied by any method that achieves the desired thickness and uniformity. In one particular embodiment of the invention, the second photoresist layer 370 is applied through a spin coating method to achieve a thickness of approximately 1 micrometer.

Still referring to FIG. 7(C), in STEP 13 the second photoresist layer 370 is patterned in such a way as to create the desired shape of an eventual cavity below the first dielectric layer 345. Any method of patterning the second photoresist layer 370 that achieves the desired shape and resolution may be employed. In one embodiment of the present invention, the second photoresist layer 370 may be patterned through lithography. The result of this patterning in the second photoresist layer 370 is the creation of void 371 in the desired shape.

Still referring to FIG. 7(C), STEP 14 illustrates the patterning of the second preparation layer 330 into the same shape as the void 371 that was patterned into the photoresist layer 370. This patterning of the second preparation layer 330 with the shape of the void 371 may be accomplished through any method that achieves the desired shape and resolution without causing damage to the device. In one embodiment of the present invention, a Buffered Oxide Etch (BOE) solution may be used to etch the second preparation layer 330 with the shape of void 371 to create a void 380. It should be appreciated that the shape and placement of the void 380 should be such that it corresponds to the area of the substrate 310 which lies under the portion of the patterned conductive layer 358 which serves as the sensing device.

Still referring to FIG. 7(C), STEP 15 illustrates the removal of the second photoresist layer 370. In one embodiment of the invention, the second photoresist layer 370 may be removed through use of an acetone solvent. It should be appreciated that any method that effectively removes the second photoresist layer 370 while allowing the second preparation layer 330 and the void 380 to remain without causing damage to the sensor may be used.

Still referring to FIG. 7(C), STEP 16 illustrates the creation of a cavity 390 to create diaphragm 400. For successful creation of a cavity 390 and diaphragm 400, a method of manufacturing may be used that removes material from the substrate 310 and the attachment layer 340 in the shape of the void 380 while not removing material from the first dielectric layer 345 to leave the first dielectric layer 345, patterned conductive layer 358, and second dielectric layer 360 intact to create the diaphragm 400. These processes may include mechanical material removal, as with a drill, mill, or other machine tools, material removal with a laser or other thermal or radiant energy, or chemical material removal as through use of an acidic, basic, or etching compound. In one embodiment of the invention, the removal of material from the substrate 310 and the attachment layer 340 is achieved through etching in the direction of the second preparation layer 330 towards the attachment layer 340 in a Xenon difluoride etching chamber. It should be appreciated that in this embodiment of the invention, the second preparation layer 330 serves as a template for the cavity 390 by resisting the etching process in all areas except where the second preparation layer 330 was removed to create the void 380. It should also be appreciated that when using a Xenon difluoride etching chamber that the use of polyimide for the first dielectric layer 345 serves to provide a stop for the etching process. However, nothing should be construed to limit the process to these particular materials, as a variety of materials other than polyimide may serve as effective etch stops, both for Xenon difluoride etching and other etching processes, just as polyimide may serve as an effective etch stop for other etching processes as well.

It should be appreciated that the order of the steps (or portions thereof) as discussed herein may vary, be interchanged, combined; as well as some steps (or portions thereof) may be omitted.

It should be appreciated that any of the components, devices, circuitry, or modules referred to with regards to any of the present invention embodiments discussed herein, may be a variety of materials and/or composites as necessary or required.

Still further, it should be appreciated that any of the components, devices, circuitry or modules (or combination thereof) may be provided with a shape, size and volume contoured by adjusting its geometry and flexibility/rigidity according to the operation of the sensor device and use and utilization. Any dimensions, such as length or thickness, may be increased or decreased compared to any limitations specifically stated in this disclosure.

Any temperature or duration (e.g., for a step, process or event) as disclosed herein may be increased or decreased for any limitations specifically stated in this disclosure.

It should be appreciated that any of the components, devices, circuitry, or modules referred to with regards to any of the present invention embodiments discussed herein, may be integrally or separately formed with one another. Further, redundant functions or structures of the components, devices, circuitry or modules may be implemented. Moreover, the various components, devices, circuitry, or modules may be communicated locally and/or remotely during operation and utilization. Moreover, the various components may be in communication via wireless and/or hardwire or other desirable and available communication means, systems and hardware, as well computer processors, computers, and processor based devices, machines and systems. Moreover, various components, devices, circuitry, and modules may be substituted with other components, devices, circuitry, and modules that provide similar functions.

EXAMPLES

Practice of an aspect of an embodiment (or embodiments) of the invention will be still more fully understood from the following examples and experimental results, which are presented herein for illustration only and should not be construed as limiting the invention in any way.

Example and Experimental Set No. 1

Figure 8:
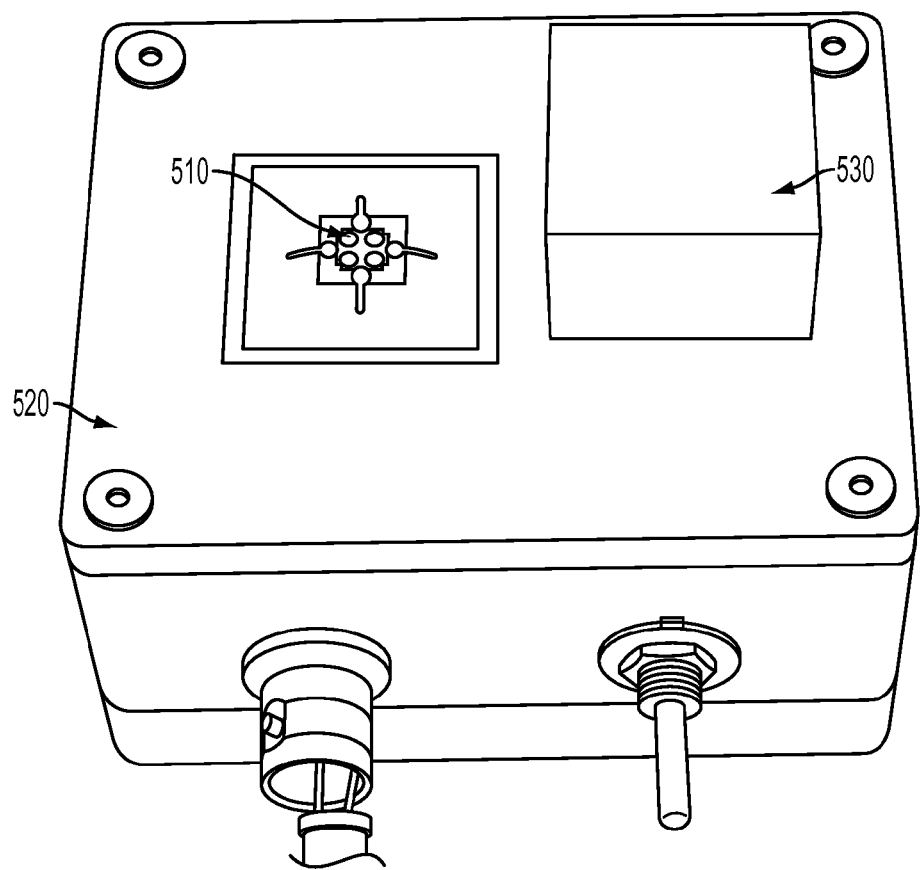
FIG. 8 provides a schematic drawing of a gas flow sensor prototype.

As illustrated in FIG. 8, four electrical contact pads of the gas flow sensor 510 are wired to the amplifier circuit, which is packaged in the sensor box 520. The sensor cover 530 protects the gas flow sensor when not in use.

Example and Experimental Set No. 2

Figure 9:
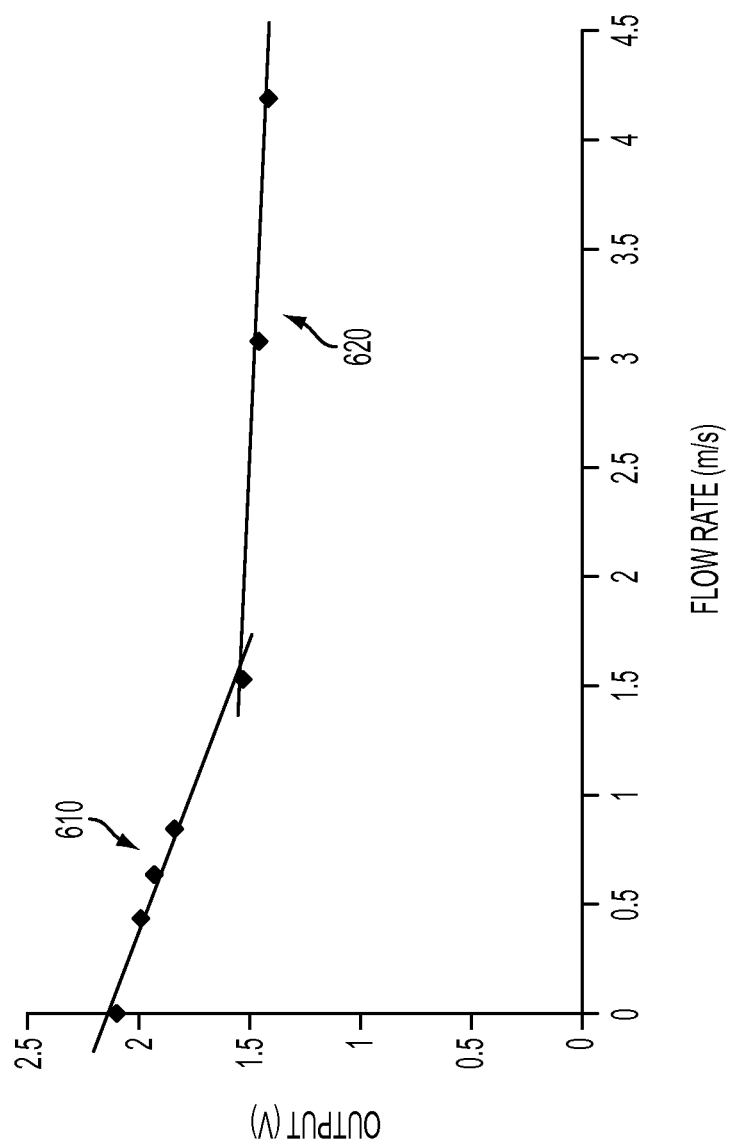
FIG. 9 provides a graphical illustration of test data, representing the voltage output at various flow rates of an embodiment of the present invention sensing device.

An experiment was carried out to calibrate the gas flow sensor. The sensor was placed in a home-built wind tunnel with variable flow rates. The result is shown in FIG. 9. At a flow rate lower than 1.5 m/s, the output of the sensor is linear to the flow rate, with an approximate change of 374 mV per m/s 610. However, at a higher flow rate over 1.5 m/s, the sensor output rate of change decreases to about 45 mV per m/s 620.

It should be appreciated that the rate of change in the output of the sensor for given flow rates may be adjusted by altering the physical and electrical properties of the device. For instance, a sensor that is more responsive to higher flow rates may be produced by increasing the power to the conductive layer, increasing the resistance, or increasing the thickness of the diaphragm without necessarily increasing the size, though changes to any dimension of the sensor are also permissible.

Said differently, an embodiment of the sensor is designed more sensitive at a low flow rate than at a high flow rate. For a specific design, the sensor output saturates or stagnates when the gas flow is beyond a certain value. To make the sensor sensitive at high flow rate, some design rules may be adhered to as follows: increasing the resistance of the conductive layer; increasing overall size of the device; increasing the power applied to the conductive layer, or implementing other methods available to one skilled in the art. One of the goals is to make the saturation point beyond the measured gas flow. It should also be appreciated that any property that may be increased may also be decreased to suit the particular needs of any application.

It should be appreciated that the rate of change in the output of the sensor for given flow rates may be adjusted by altering the physical and electrical properties of the device. For instance, a sensor that is more responsive to higher flow rates may be produced by increasing the resistance of the conductive layer, increasing the power to the conductive layer, making the conductive layer larger, increasing the overall size of the device, or other methods known in the art.

Example and Experimental Set No. 3

Figure 10B:
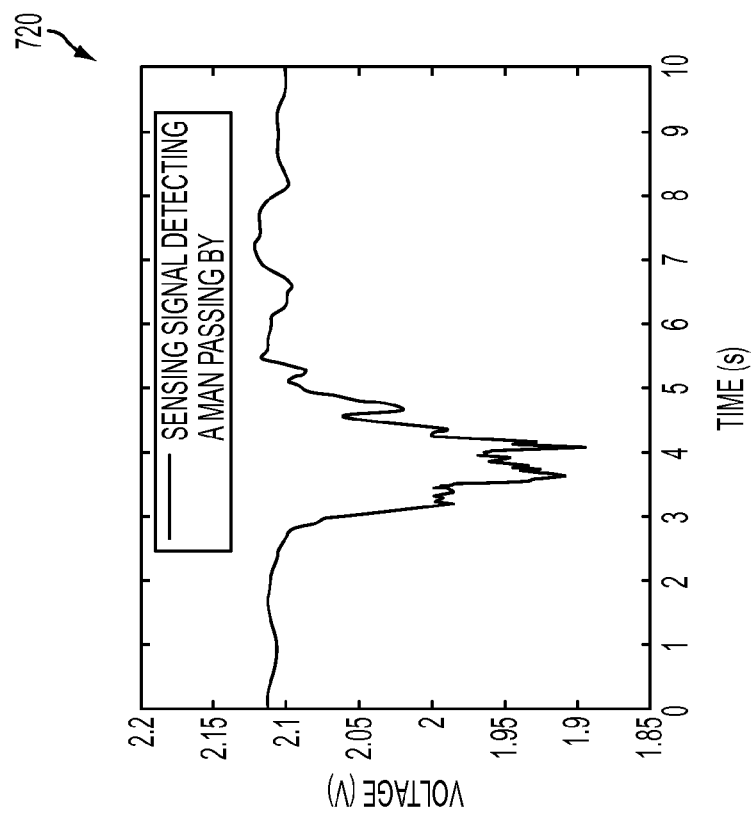
FIG. 10(B) provides a graphical illustration of test data, representing the response of an embodiment of the present invention sensing device to the air disturbance of a human walking nearby.
Figure 10A:
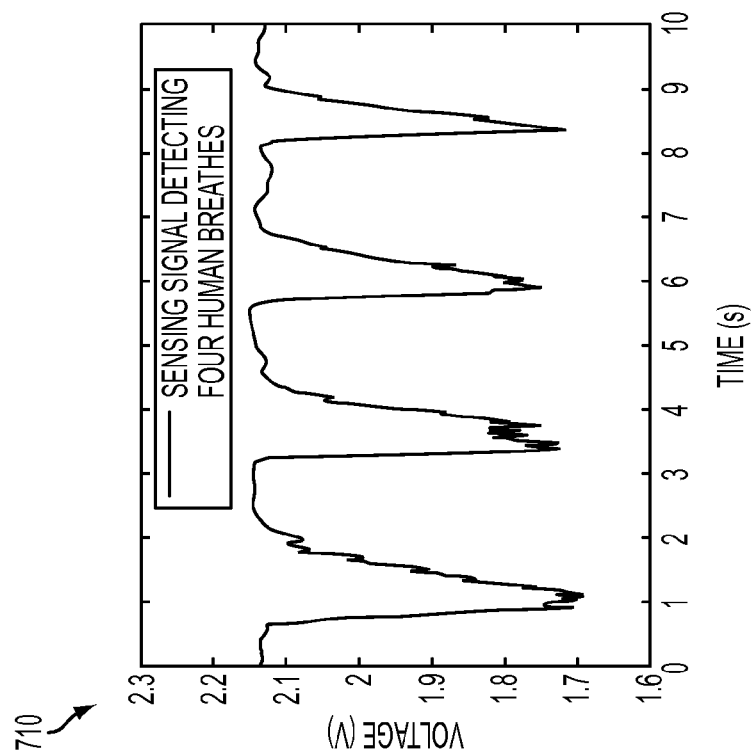
FIG. 10(A) provides a graphical illustration of test data, representing the response of an embodiment of the present invention sensing device to human respiration.

Another experiment was carried out to test the sensitivity of the sensor over different disturbances. FIG. 10(A) and FIG. 10(B) show the results of this experiment. FIG. 10(A) is the response of the sensor upon human respiration at a distance of approximately 50 mm. FIG. 10(B) is the response of the sensor to the air disturbance by nearby human walking.

Example and Experimental Set No. 4

Figure 11:
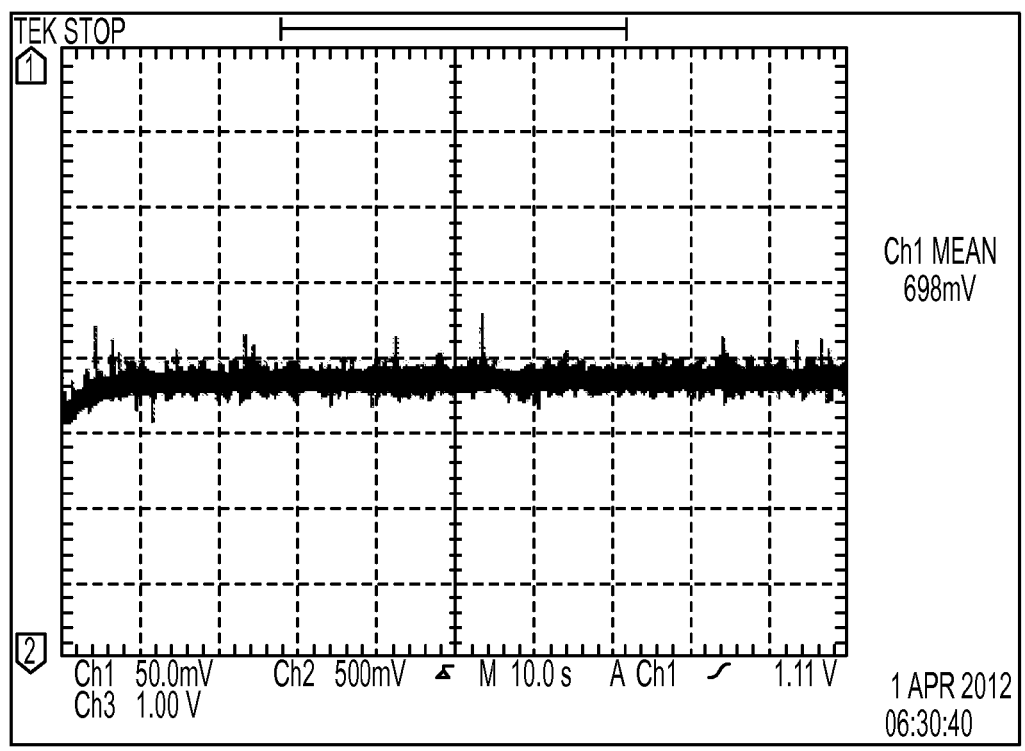
FIG. 11 provides a graphical illustration of test data, representing the long-term operation drift of an embodiment of the present invention sensing device.

Another experiment was carried out to test the long-term drift of the sensor. In order to avoid the disturbance of airflow, the sensor was covered during the test. In FIG. 11, the output signal was monitored by a digital oscilloscope. When the power was turned on, the sensor output reached a stable state in less than 5 seconds. Overall thermal drift is less than 10 mV/hr.

Example and Experimental Set No. 5

Figure 12:
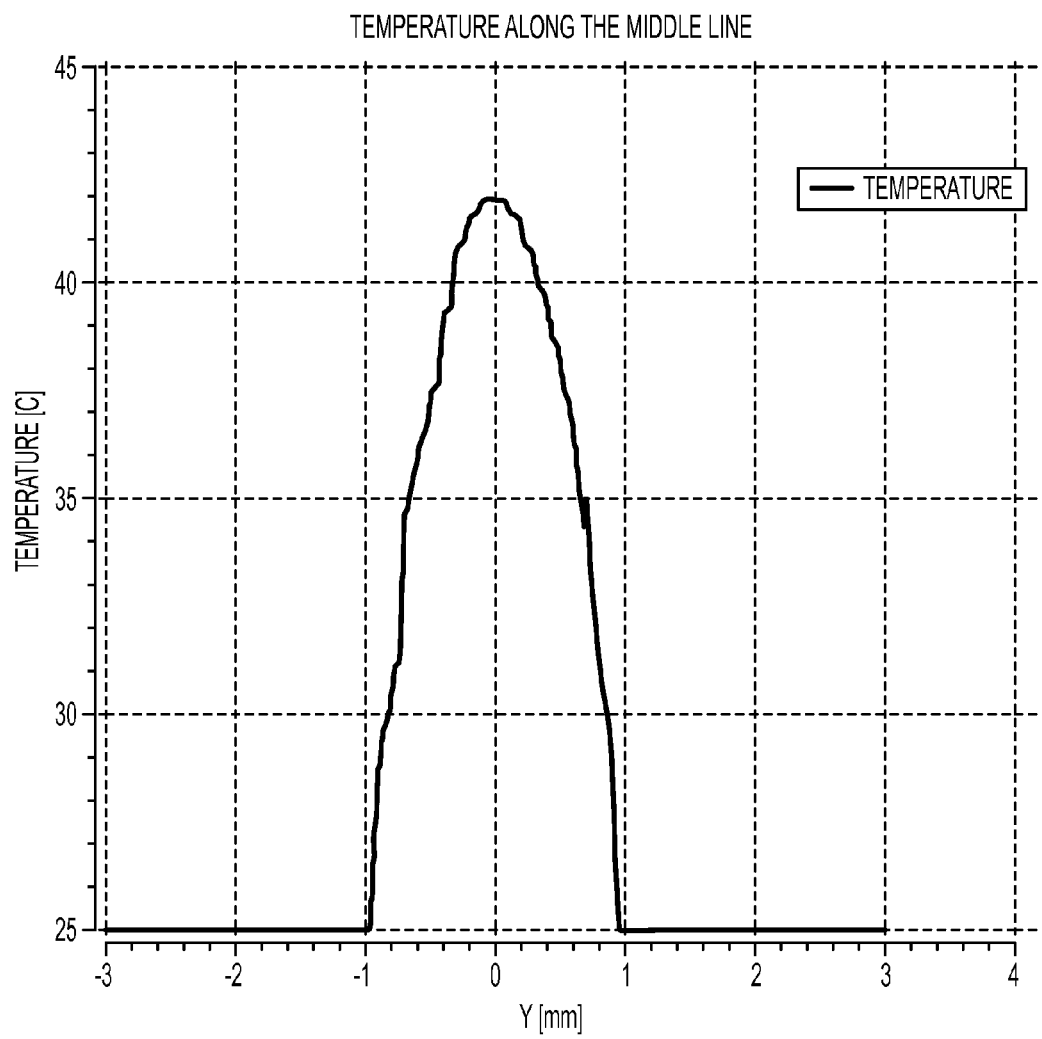
FIG. 12 illustrates a graphical image of a simulation for the temperature profile along the conductive film of a particular embodiment of the sensing device.
Figure 13:
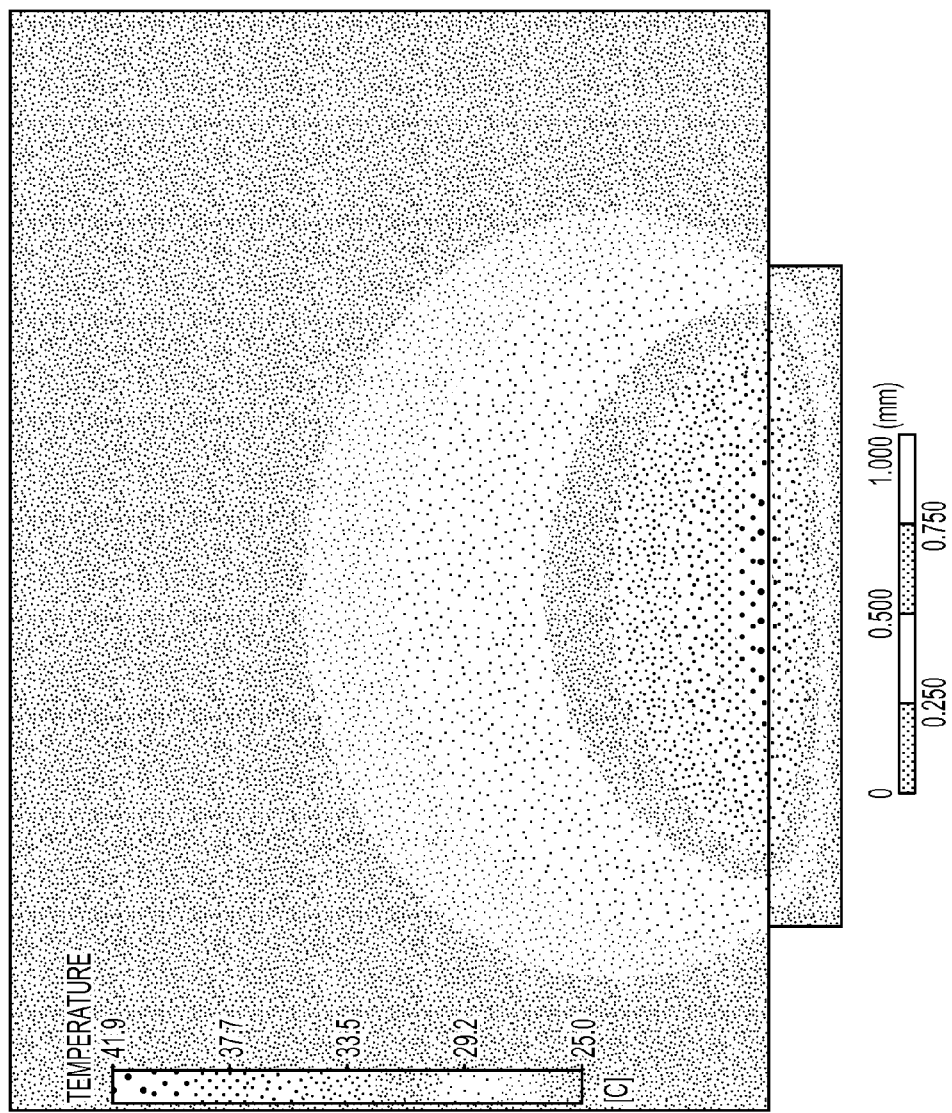
FIG. 13 illustrates temperature contour image from the simulation of FIG. 12.

Another experiment was carried out to simulate the uniformity of heating for an embodiment of the sensing device. FIG. 12 illustrates a graphical image of the simulation for the temperature profile along the conductive layer. The center of the conductive layer is zero on the horizontal axis. The polyimide diaphragm spans from −1 to 1 mm. The conductive layer spans from −0.75 to 0.75 mm. The results showed that the temperature in the middle is the highest, but is relatively uniform for the whole area where the conductive layer is located. FIG. 13 illustrates temperature contour image from the simulation of FIG. 12 and thereby illustrates the temperature distribution of the local space around the sensing device. The results showed that the temperature in the middle is the highest, but is relatively uniform for the whole area where the conductive layer is located.

Referring to temperature profile graphically illustrated in FIG. 12, the related temperature distribution may be observed. The rate of temperature change (C.°/mm) across the portion of the conductive layer starting at the left side (−0.75 mm) of the conductive layer appears to show a rate of 14.3 C.°/mm. The change of temperature (10.75° C.) over the distance of the conductive layer span (0.75 mm) equates to 14.3 C.°/mm. Similarly, the rate of temperature change (C.°/mm) across the portion of the conductive layer starting at the right side (0.75 mm) of the conductive layer appears to show a rate of 13.2 C.°/mm. The change of temperature (9.9° C.) over distance of the conductive layer span (0.75 mm) equates to 13.2 C.°/mm.

Next, the rate of temperature change (C.°/mm) across the portion of the edge of the polyimide diaphragm starting at the left side (−1.00 mm to −0.75 mm) of the polyimide diaphragm appears to show a rate of 24.8 C.°/mm. The change of temperature (6.2° C.) over distance of the diaphragm span (0.25 mm) equates to 24.8 C.°/mm. Similarly, the rate of temperature change (C.°/mm) across the portion of the edge of the polyimide diaphragm starting at the right side (1.00 mm to 0.75 mm) of the polyimide diaphragm appears to show a rate of 28 C.°/mm. The change of temperature (7° C.) over distance of the diaphragm span (0.25 mm) equates to 28 C.°/mm.

The overall span of the polyimide diaphragm span and conductive layer that spans each side (−1 to 0 mm and 0 to 1 mm, respectively) has a rate of 16.9 C.°/mm. The change of temperature (16.9° C.) over distance of the diaphragm and conductive layer span (1.0 mm) equates to 16.9 C.°/mm.

In summary, the rate of temperature change associated with this particular experiment for the two areas of conductive layer ranges from about 13-14° C./mm. Moreover, the rate of temperature change associated with this particular experiment for the two areas of exclusively diaphragm ranges from about 24-28° C./mm. Still further yet, for both portions combined (conductive layer and diaphragm) the rate of temperature change is about 16-17° C./mm. It should be appreciated that these ranges for rate of temperature change pertain specifically to this experiment. Nonetheless, in this instance it serves to represent a quantification for defining an example of uniform heating of the diaphragm. For instance, the overall temperature distribution associated with the experiment conducted in Set. No. 6 is considerably flatter and thus would have a considerably lower rate of temperature change. For example, it is hypothesized that the rate of temperature change for FIG. 14 (discussed below) would be in the range of about 3-10° C./mm. For both portions combined (i.e., inward portion—conductive layer and diaphragm), the conductive layer rate of temperature change could be about 3° C./mm. For the edge portions (exclusively the diaphragm portion), the rate of temperature change could be about 10° C./mm. And thereby, represent an exemplary (i.e., intended to herein for illustration and should not be construed as limiting the invention in any way) quantitative representation for defining an example of uniform heating of the diaphragm.

It should be appreciated that a characteristic of various embodiments of the present invention provides a uniform or substantially uniform temperature distribution over the conductive layer, and by implementing various design parameters as disclosed herein, the temperature distribution may be altered. It should be appreciated that various approaches and embodiments that may be employed are within the context of the present invention.

Example and Experimental Set No. 6

Figure 14:
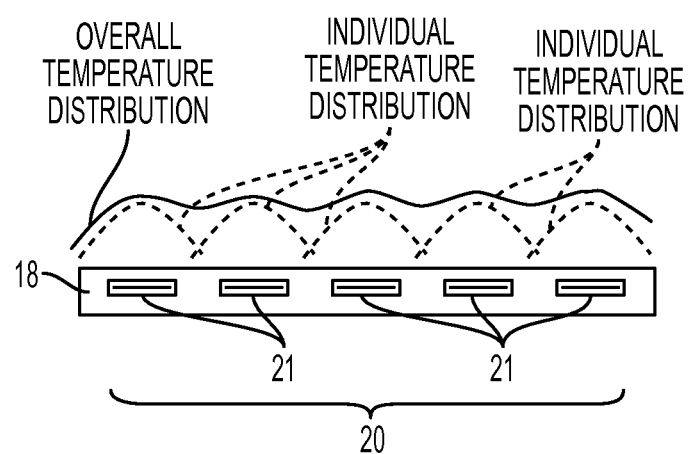
FIG. 14 illustrates a graphical image of the simulated temperature distribution as it corresponds with a schematic cross-sectional view of an embodiment of the sensing device.

Another experiment was carried out to simulate the uniformity of heating for an embodiment of the sensing device. FIG. 14 illustrates a graphical image of the temperature distribution as it corresponds with a schematic cross-sectional view of an embodiment of the sensing device. A coil configuration of the conductive film 20 is disposed among a polyimide diaphragm 18. Referring to the drawing, individual segments 21 of the coiled conductive film 20 may produce individual temperature distributions. These individual temperature distributions overlap with one another, and, in part because of their additive nature, create an overall temperature distribution that is smooth and relatively uniform. Since the coiled conductive film 20 is disposed and configured across the polyimide diaphragm 18 the overall temperature distribution of the sensing device is relatively uniform.

Example and Experimental Set No. 7

Without wishing to be bound by any particular theory it is hypothesized that the rate of temperature change associated with the conductive layer for various embodiments of the present invention would be in the range of about 1° C./mm to about 30° C./mm, with various magnitudes there between, such as about 10° C./mm. Accordingly, these levels represent a quantitative representation for defining an example of uniform heating of different embodiments of the diaphragm. It should be appreciated that the design approaches may be implemented within the context of the present invention that would also include a level greater or less than, as well as any intermittent levels there between.

Additional Examples

Example 1

A low power electronic sensing device for use measuring gaseous flow. The device may comprise: a dielectric layer with a first surface in communication with a flow to be measured; a substrate in communication with a second surface of the dielectric layer; a cavity in the substrate, wherein a portion of the dielectric layer being substantially in communication with the cavity to form a diaphragm; and a conductive layer disposed on or inside the diaphragm.

Example 2

The device of example 1, wherein the conductive layer is metallic.

Example 3

The device of example 1 (as well as subject matter of example 2), wherein the substrate is substantially rigid.

Example 4

The device of example 1 (as well as subject matter of one or more of any combination of examples 2-3), wherein the conductive layer is configured to heat the diaphragm in a substantially uniform manner.

Example 5

The device of example 1 (as well as subject matter of one or more of any combination of examples 2-4), wherein the dielectric layer comprises polyimide.

Example 6

The device of example 1 (as well as subject matter of one or more of any combination of examples 2-5), wherein the dielectric layer comprises two layers of polyimide.

Example 7

The device of example 1 (as well as subject matter of one or more of any combination of examples 2-6), wherein the dielectric layer comprises two layers.

Example 8

The device of example 1 (as well as subject matter of one or more of any combination of examples 2-7), wherein the substrate comprises mono-crystalline silicon.

Example 9

The device of example 7 (as well as subject matter of one or more of any combination of examples 2-8), wherein the substrate is adhered to the dielectric layer through use of a porous silicon mating surface.

Example 10

The device of example 1 (as well as subject matter of one or more of any combination of examples 2-9), wherein the communication between the substrate and the second surface of the dielectric layer comprises an intervening layer.

Example 11

The device of example 1 (as well as subject matter of one or more of any combination of examples 2-10), wherein the communication between the substrate and the second surface of the dielectric layer comprises a promoter.

Example 12

The device of example 11 (as well as subject matter of one or more of any combination of examples 2-11), wherein the promoter comprises DUPONT VM-622.

Example 13

The device of example 1 (as well as subject matter of one or more of any combination of examples 2-12), wherein the communication between the substrate and the second surface of dielectric layer comprises the substrate layers in direct contact with the second surface of thin dielectric layer.

Example 14

The device of example 1 (as well as subject matter of one or more of any combination of examples 2-13), wherein the diaphragm is configured so as to have no support across its area.

Example 15

The device of example 1 (as well as subject matter of one or more of any combination of examples 2-14), wherein the cavity is configured so as to have one or more ancillary structures within its space.

Example 16

The device of example 1 (as well as subject matter of one or more of any combination of examples 2-15), wherein the cavity is configured so as to have no structure or material within its space.

Example 17

The device of example 1 (as well as subject matter of one or more of any combination of examples 2-16), wherein the communication of the dielectric layer with the cavity comprises being suspended over the cavity.

Example 18

The device of example 1 (as well as subject matter of one or more of any combination of examples 2-17), wherein the diaphragm is circular in shape.

Example 19

The device of example 1 (as well as subject matter of one or more of any combination of examples 2-18), wherein the diaphragm is substantially round in shape.

Example 20

The device of example 1 (as well as subject matter of one or more of any combination of examples 2-19), wherein the diaphragm is elliptical in shape.

Example 21

The device of example 1 (as well as subject matter of one or more of any combination of examples 2-20), wherein the diaphragm has a single vertex.

Example 22

The device of example 1 (as well as subject matter of one or more of any combination of examples 2-21), wherein the diaphragm is polygonal in shape with three or more vertices.

Example 23

The device of example 1 (as well as subject matter of one or more of any combination of examples 2-22), wherein the diaphragm is shaped as a simple, convex closed plane curve.

Example 24

The device of example 1 (as well as subject matter of one or more of any combination of examples 2-23), wherein the conductive layer is disposed inside the diaphragm.

Example 25

The device of example 1 (as well as subject matter of one or more of any combination of examples 2-24), wherein the conductive layer is disposed with layers of polyimide on both sides.

Example 26

The device of example 1 (as well as subject matter of one or more of any combination of examples 2-25), wherein the conductive layer is disposed with a first dielectric layer and a second dielectric layer on opposite sides of the conductive film.

Example 27

The device of example 1 (as well as subject matter of one or more of any combination of examples 2-26), wherein the conductive layer is a wire.

Example 28

The device of example 1 (as well as subject matter of one or more of any combination of examples 2-27), wherein the device does not require directional calibration.

Example 29

The device of example 1 (as well as subject matter of one or more of any combination of examples 2-28), wherein the device experiences low levels of drift during long periods of operation.

Example 30

The device of example 1 (as well as subject matter of one or more of any combination of examples 2-29), wherein the configuration of the conductive layer is patterned across the area of the diaphragm in a radial serpentine pattern creating an arc concentric with a circumferential serpentine pattern.

Example 31

The device of example 1 (as well as subject matter of one or more of any combination of examples 2-30), wherein the configuration of the conductive layer is patterned across the area of the diaphragm in a spiral-wound shape pattern.

Example 32

The device of example 1 (as well as subject matter of one or more of any combination of examples 2-31), wherein the configuration of the conductive layer is patterned across the area of the diaphragm in concentric, substantially circular coils.

Example 33

The device of example 1 (as well as subject matter of one or more of any combination of examples 2-32), wherein the configuration of the conductive layer is patterned across the area of the diaphragm in repeating patterns.

Example 34

The device of example 1 (as well as subject matter of one or more of any combination of examples 2-33), wherein the configuration of the conductive layer is patterned across the area of the diaphragm in repeating sections.

Example 35

The device of example 1 (as well as subject matter of one or more of any combination of examples 2-34), wherein the configuration of the conductive layer is patterned to section the diaphragm into two or more segments, and wherein the segments are patterned to uniformly heat the diaphragm.

Example 36

The device of example 1 (as well as subject matter of one or more of any combination of examples 2-35), wherein the configuration of the conductive layer is patterned across the area of the diaphragm in a regular pattern.

Example 37

The device of example 1 (as well as subject matter of one or more of any combination of examples 2-36), wherein the configuration of the conductive layer is patterned across the area of the diaphragm in a serpentine progression across the area of the diaphragm.

Example 38

The device of example 1 (as well as subject matter of one or more of any combination of examples 2-37), wherein the configuration of the conductive layer is patterned across the area of the diaphragm in an irregular pattern.

Example 39

The device of example 1 (as well as subject matter of one or more of any combination of examples 2-38), wherein the configuration of the conductive layer is patterned across the area of the diaphragm in any pattern which will create uniform, or substantially uniform, heating across the area of the diaphragm.

Example 40

The device of example 1 (as well as subject matter of one or more of any combination of examples 2-39), wherein the shape of the diaphragm and the configuration of the conductive layer provides for the flow (3) to be measured from any direction across the sensor irrespective of which direction the flow comes from.

Example 41

A method for manufacturing a low power electronic sensing device for use measuring gaseous flow. The method may comprise: providing a substrate having a first side and a second side; applying a first dielectric layer in communication with the substrate; applying a conductive layer in communication with the first dielectric layer; applying a second dielectric layer in communication with the first dielectric layer and the conductive layer; and creating a cavity in the substrate in communication with the first dielectric layer to form a diaphragm.

Example 42

The method of example 41 (as well as subject matter of one or more of any combination of examples 1-40), wherein the substrate comprises double-side polished silicon wafer Example 43

The method of example 41 (as well as subject matter of one or more of any combination of examples 1-40 and example 42), wherein the substrate comprises monocrystalline silicon.

Example 44

The method of example 41 (as well as subject matter of one or more of any combination of examples 1-40 and examples 42-43), wherein the first dielectric layer comprises polyimide.

Example 45

The method of example 41 (as well as subject matter of one or more of any combination of examples 1-40 and examples 42-44), further comprises applying the first dielectric layer through a spin-on coating process.

Example 46

The method of example 41 (as well as subject matter of one or more of any combination of examples 1-40 and examples 42-45), wherein the first dielectric layer comprises approximately 2 to 3 micrometers of thickness.

Example 47

The method of example 41 (as well as subject matter of one or more of any combination of examples 1-40 (as well as subject matter of one or more of any combination of examples 1-40 and examples 42-46), wherein the conductive layer comprises platinum, gold, silver, copper, tungsten, nickel, aluminum, or any combination thereof.

Example 48

The method of example 41 (as well as subject matter of one or more of any combination of examples 1-40 and examples 42-47), wherein the conductive layer comprises an alloy.

Example 49

The method of example 41 (as well as subject matter of one or more of any combination of examples 1-40 and examples 42-48), wherein the conductive layer comprises a metal.

Example 50

The method of example 41 (as well as subject matter of one or more of any combination of examples 1-40 and examples 42-49), wherein the conductive layer comprises a non-metallic material.

Example 51

The method of example 41 (as well as subject matter of one or more of any combination of examples 1-40 and examples 42-50), wherein the conductive layer comprises an organic compound.

Example 52

The method of example 41 (as well as subject matter of one or more of any combination of examples 1-40 and examples 42-51), wherein the conductive layer comprises a composite material.

Example 53

The method of example 41 (as well as subject matter of one or more of any combination of examples 1-40 and examples 42-52), wherein the conductive layer comprises approximately 100 nanometers of thickness.

Example 54

The method of example 41 (as well as subject matter of one or more of any combination of examples 1-40 and examples 42-53), further comprises applying the conductive layer through a sputter technique.

Example 55

The method of example 41 (as well as subject matter of one or more of any combination of examples 1-40 and examples 42-54), wherein the second dielectric layer comprises polyimide.

Example 56

The method of example 41 (as well as subject matter of one or more of any combination of examples 1-40 and examples 42-55), further comprises applying the second dielectric layer through a spin-on coating process.

Example 57

The method of example 41 (as well as subject matter of one or more of any combination of examples 1-40 and examples 42-56), wherein the second dielectric layer comprises approximately 2 to 3 micrometers of thickness.

Example 58

The method of example 41 (as well as subject matter of one or more of any combination of examples 1-40 and examples 42-57), further comprises creating the cavity through use of a Xenon difluoride etching chamber.

Example 59

The method of example 41 (as well as subject matter of one or more of any combination of examples 1-40 and examples 42-58), further comprises creating the cavity by etching.

Example 60

The method of example 41 (as well as subject matter of one or more of any combination of examples 1-40 and examples 42-59), further comprises creating a first preparation layer on the first side of the substrate.

Example 61

The method of example 60 (as well as subject matter of one or more of any combination of examples 1-59), wherein the first preparation layer comprises silicon oxide

Example 62

The method of example 60 (as well as subject matter of one or more of any combination of examples 1-59 and example 61), further comprises growing the first preparation layer in a wet oxidation furnace.

Example 63

The method of example 60 (as well as subject matter of one or more of any combination of examples 1-59 and examples 61-62), wherein the first preparation layer comprises approximately 300 to 600 nanometers of thickness.

Example 64

The method of example 41 (as well as subject matter of one or more of any combination of examples 1-40 and examples 42-63), further comprises creating a second preparation layer on the second side of the substrate.

Example 65

The method of example 64 (as well as subject matter of one or more of any combination of examples 1-63), wherein the second preparation layer comprises silicon oxide.

Example 66

The method of example 64 (as well as subject matter of one or more of any combination of examples 1-63 and example 65), further comprises growing the first preparation layer in a wet oxidation furnace.

Example 67

The method of example 64 (as well as subject matter of one or more of any combination of examples 1-63 and examples 65-66), wherein the first preparation layer comprises approximately 300 to 600 nanometers of thickness. It should be appreciated that the thickness may be greater than or less than.

Example 68

The method of example 64 (as well as subject matter of one or more of any combination of examples 1-63 and examples 65-67), further comprises removing the first preparation layer.

Example 69

The method of example 68 (as well as subject matter of one or more of any combination of examples 1-67), further comprises removing the first preparation layer with a buffered oxide etch solution.

Example 70

The method of example 41 (as well as subject matter of one or more of any combination of examples 1-40 and examples 42-69), further comprises creating an attachment layer on the first side of the substrate.

Example 71

The method of example 70 (as well as subject matter of one or more of any combination of examples 1-69), wherein the attachment layer comprises porous silicon.

Example 72

The method of example 70 (as well as subject matter of one or more of any combination of examples 1-69 and example 71), further comprises creating the attachment layer through electromechanical anodization.

Example 73

The method of example 70 (as well as subject matter of one or more of any combination of examples 1-69 and examples 71-72), further comprises creating the attachment layer through stain etching.

Example 74

The method of example 70 (as well as subject matter of one or more of any combination of examples 1-69 and examples 71-73), further comprises creating the attachment layer through metal assisted etching.

Example 75

The method of example 70 (as well as subject matter of one or more of any combination of examples 1-69 and examples 71-74), further comprises creating the attachment layer through colloidal nanoparticle assisted etching.

Example 76

The method of example 41 (as well as subject matter of one or more of any combination of examples 1-40 and examples 42-75), further comprises a first curing of the first dielectric layer.

Example 77

The method of example 76 (as well as subject matter of one or more of any combination of examples 1-75), further comprises thermal heating of the first dielectric layer.

Example 78

The method of example 76 (as well as subject matter of one or more of any combination of examples 1-75 and example 77), further comprises curing of the first dielectric layer for approximately 2 hours at approximately 350 degrees centigrade.

Example 79

The method of example 41 (as well as subject matter of one or more of any combination of examples 1-40 and examples 42-78), further comprises applying a first photoresist layer to the first dielectric layer prior to the application of the conductive layer.

Example 80

The method of example 79 (as well as subject matter of one or more of any combination of examples 1-78), further comprises applying the first photoresist layer through a spin-on coating process.

Example 81

The method of example 79 (as well as subject matter of one or more of any combination of examples 1-78), wherein the first photoresist layer comprises 1 micrometer of thickness.

Example 82

The method of example 79 (as well as subject matter of one or more of any combination of examples 1-78), further comprises patterning the photoresist layer prior to the application of the conductive layer.

Example 83

The method of example 82 (as well as subject matter of one or more of any combination of examples 1-81), further comprises patterning the photoresist layer through lithography.

Example 84

The method of example 79 (as well as subject matter of one or more of any combination of examples 1-78 and examples 80-83), further comprises removing the photoresist layer prior to the application of the second dielectric layer so as to pattern the conductive layer.

Example 85

The method of example 84 (as well as subject matter of one or more of any combination of examples 1-83), further comprises removing the photoresist layer with acetone solvent.

Example 86

The method of examples 41 (as well as subject matter of one or more of any combination of examples 1-40 and examples 42-85), further comprises a second curing of the second dielectric layer.

Example 87

The method of example 86 (as well as subject matter of one or more of any combination of examples 1-85), further comprises soft baking of the second dielectric layer.

Example 88

The method of example 86 (as well as subject matter of one or more of any combination of examples 1-85), further comprises thermal heating of the second dielectric layer.

Example 89

The method of example 86 (as well as subject matter of one or more of any combination of examples 1-85), further comprises curing of the second dielectric layer for approximately 2 minutes at approximately 100 degrees centigrade, approximately 2 minutes at approximately 110 degrees centigrade, and approximately 2 minutes at approximately 130 degrees centigrade.

Example 90

The method of example 41 (as well as subject matter of one or more of any combination of examples 1-40 and examples 42-89), further comprises exposing portions of the patterned conductive layer to form contact pads.

Example 91

The method of example 90 (as well as subject matter of one or more of any combination of examples 1-89), further comprises exposing portions of the patterned conductive layer through lithography.

Example 92

The method of example 41 (as well as subject matter of one or more of any combination of examples 1-40 and examples 42-91), further comprises a third curing of the second dielectric layer.

Example 93

The method of example 92 (as well as subject matter of one or more of any combination of examples 1-91), further comprises thermal heating of the second dielectric layer.

Example 94

The method of example 92 (as well as subject matter of one or more of any combination of examples 1-91 and 93), further comprises curing of the second dielectric layer for approximately 2 hours at approximately 350 degrees centigrade.

Example 95

The method of example 64 (as well as subject matter of one or more of any combination of examples 1-63 and 65-94), further comprises applying the second photoresist layer to the second preparation layer.

Example 96

The method of example 95 (as well as subject matter of one or more of any combination of examples 1-94), further comprises applying the second photoresist layer through a spin-on coating process.

Example 97

The method of example 95 (as well as subject matter of one or more of any combination of examples 1-94 and example 96), wherein the second photoresist layer comprises approximately 1 micrometer of thickness.

Example 98

The method of example 95 (as well as subject matter of one or more of any combination of examples 1-94 and examples 96-97), further comprises patterning the second photoresist layer.

Example 99

The method of example 98 (as well as subject matter of one or more of any combination of examples 1-97), further comprises patterning the second photoresist layer through lithography.

Example 100

The method of example 64 (as well as subject matter of one or more of any combination of examples 1-63 and 65-99), further comprises patterning the second preparation layer.

Example 101

The method of example 100 (as well as subject matter of one or more of any combination of examples 1-99), further comprises patterning the second preparation layer with a buffered oxide etch solution.

Example 102

The method of example 95 (as well as subject matter of one or more of any combination of examples 1-94 and examples 96-101), further comprises removing the second photoresist layer.

Example 103

The method of example 102 (as well as subject matter of one or more of any combination of examples 1-101), further comprises removing the second photoresist layer with acetone solvent.

Example 104

The method of example 41 (as well as subject matter of one or more of any combination of examples 1-40 and examples 42-103), wherein the communication between the first dielectric layer and the substrate comprises a promoter.

Example 105

The method of example 104, wherein the promotor is DUPONT VM-622.

Example 106

The method of example 41 (as well as subject matter of one or more of any combination of examples 1-40 and examples 42-105), wherein the communication between the first dielectric layer and the substrate comprises a mechanical attachment.

Example 107

The method of example 41 (as well as subject matter of one or more of any combination of examples 1-40 and examples 42-106), wherein the communication between the first dielectric layer and the substrate comprises a chemical attachment.

Example 108

The method of example 41 (as well as subject matter of one or more of any combination of examples 1-40 and examples 42-107), wherein the cavity is configured so as to have one or more ancillary structures within its space.

Example 109

The method of example 41 (as well as subject matter of one or more of any combination of examples 1-40 and examples 42-108), wherein the cavity is configured so as to have no structure or material within its space.

The devices, systems, modules, circuitry, processors, compositions, and methods of various embodiments of the invention disclosed herein may utilize aspects disclosed in the following references, applications, publications and patents and which are hereby incorporated by reference herein in their entirety (and which are not admitted to be prior art with respect to the present invention by inclusion in this section):

1. Q. Z. Wei, et al., "Hybrid System for airspeed measurement using dual MEMS sensors", Proceedings of the 2011 6$^{th}$ IEEE International Conference on Nano/Micro Engineered and Molecular Systems, Feb. 20-23, 2011, Kaohsiung, Taiwan.
2. Bahram Azizollah Ganzi, "Design and Fabrication of a Novel MEMS Silicon Microphone", Dept. of Electrical Engineering, Babol University of Technology, Iran, Crystalline Silicon—Properties and Uses, 14. http://www.intechopen.com/source/pdfs/17734/InTech~Mems_silicon_microphone.pdf.
3. M. Pedersen, et al., "A capacitive differential pressure sensor with polyimide diaphragm", J. Micromech. Microeng. 7 (1997) 250-252.
4. U.S. Pat. No. 7,357,035 B2, Liu, et al., "Sensor Chip and Apparatus for Tactile And/Or Flow Sensing", Apr. 15, 2008.
5. Buder, U., et al., "AeroMEMS Wall Hot-Wire Anemometer on Polyimide Substrate Featuring Top Side or Bottom Side Bondpads", IEEE Sensors Journal, Vol. 7, No. 8, August 2007.
6. Ewing, J., et al., "A direct-measurement thin-film heat flux sensor array", Measurement Science and Technology, 21 (2010), 105201, p. 1-8.
7. Hopson, P., "Thin Hot-Film Sensors on Polymide Film", NASA Tech. Briefs, March 1993, p. 102-103.
8. U.S. Pat. No. 5,848,517, Hopson, Jr., P., "Method of Forming Multi-Element Thin Hot Film Sensors on Polymide Film", Jan. 16, 1996.
9. U.S. Pat. No. 5,789,020, Tran, S., "Method of Forming a Hot Film Sensor System on a Model", Aug. 4, 1998.
10. U.S. Patent Application Publication No. 2010/0139391 A1, Sakuma, N., "Thermal Fluid Flow Sensor and Method of Manufacturing the Same", Jun. 10, 2010.
11. U.S. Pat. No. 4,914,742, Higashi, R., et al., "Thin Film Orthogonal Microsensor for Air Flow and Method", Apr. 3, 1990.
12. U.S. Pat. No. 8,132,455 B2, Chen, C., et al., "Robust Micromachined Thermal Mass Flow Sensor with Double Side Passivated Polyimide Membrane", Mar. 13, 2012.
13. Kuoni, A., et al., "Polyimide Membrane with ZnO Piezoelectric Thin Film Pressure Transducers as a Differential Pressure Liquid Flow Sensor", Journal of Micromechanics and Microengineering, 13 (2003) S103-!107.
14. Stemme, G., "A Monolithic Gas Flow Sensor with Polyimide as Thermal Insulator", IEEE Transactions on Electron Devices, V. ED-33, No. 10, October 1986.

In summary, while the present invention has been described with respect to specific embodiments, many modifications, variations, alterations, substitutions, and equivalents will be apparent to those skilled in the art. The present invention is not to be limited in scope by the specific embodiment described herein. Indeed, various modifications of the present invention, in addition to those described herein, will be apparent to those of skill in the art from the foregoing description and accompanying drawings. Accordingly, the invention is to be considered as limited only by the spirit and scope of the following examples, including all modifications and equivalents.

Still other embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of this application. For example, regardless of the content of any portion (e.g., title, field, background, summary, abstract, drawing figure, etc.) of this application, unless clearly specified to the contrary, there is no requirement for the inclusion in any example herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. Unless clearly specified to the contrary, there is no requirement for any particular described or illustrated activity or element, any particular sequence or such activities, any particular size, speed, material, dimension or frequency, or any particular interrelationship of such elements. Accordingly, the descriptions and drawings are to be regarded as illustrative in nature, and not as restrictive. Moreover, when any number or range is described herein, unless clearly stated otherwise, that number or range is approximate. When any range is described herein, unless clearly stated otherwise, that range includes all values therein and all sub ranges therein. Any information in any material (e.g., a United States/foreign patent, United States/foreign patent application, book, article, etc.) that has been incorporated by reference herein, is only incorporated by reference to the extent that no conflict exists between such information and the other statements and drawings set forth herein. In the event of such conflict, including a conflict that would render invalid any example herein or seeking priority hereto, then any such conflicting information in such incorporated by reference material is specifically not incorporated by reference herein.

We claim:

1. A low power electronic sensing device for use in measuring gaseous flow, said device comprising:
    a dielectric layer with a first surface in communication with a flow to be measured;
    a substrate in communication with a second surface of said dielectric layer, the substrate comprising silicon;
    a cavity in said substrate, wherein a portion of said dielectric layer is substantially in communication with said cavity to form a diaphragm; and
    a conductive layer disposed on or inside said diaphragm;
    wherein the dielectric layer is adhered to the substrate using a porous silicon attachment layer.

2. The device of claim 1, wherein said conductive layer is metallic.

3. The device of claim 1, wherein said conductive layer is configured to heat said diaphragm in a substantially uniform manner.

4. The device of claim 1, wherein said dielectric layer comprises polyimide.

5. The device of claim 1, wherein said dielectric layer comprises two layers of polyimide.

6. The device of claim 1, wherein said dielectric layer comprises two layers.

7. The device of claim 1, wherein said substrate comprises mono-crystalline silicon.

8. The device of claim 1, wherein said communication between said substrate and said second surface of said dielectric layer comprises a promoter.

9. The device of claim 8, wherein said promoter comprises DUPONT VM-652.

10. The device of claim 1, wherein said diaphragm is configured so as to have no support across its area.

11. The device of claim 1, wherein said cavity is configured so as to have one or more ancillary structures within its space.

12. The device of claim 1, wherein said cavity is configured so as to have no structure or material within its space.

13. The device of claim 1, wherein the communication of said dielectric layer with said cavity comprises being suspended over said cavity.

14. The device of claim 1, wherein said diaphragm comprises a shape that includes one of the following: circular in shape; substantially round in shape; elliptical in shape; a shape that has a single vertex; a polygonal shape with three or more vertices; or a simple, convex closed plane curve shape.

15. The device of claim 1, wherein said conductive layer is disposed inside said diaphragm.

16. The device of claim 1, wherein said conductive layer is disposed with layers of polyimide on both sides.

17. The device of claim 1, wherein said conductive layer is disposed with a first dielectric layer and a second dielectric layer on opposite sides of said conductive film.

18. The device of claim 1, wherein said conductive layer is a wire.

19. The device of claim 1, wherein said device does not require directional calibration.

20. The device of claim 1, wherein said device experiences low levels of drift during long periods of operation.

21. The device of claim 1, wherein said configuration of said conductive layer is patterned across the area of said diaphragm in a radial serpentine pattern creating an arc concentric with a circumferential serpentine pattern.

22. The device of claim 1, wherein said configuration of said conductive layer is patterned across the area of said diaphragm in a spiral-wound shape pattern.

23. The device of claim 1, wherein said configuration of said conductive layer is patterned across the area of said diaphragm in concentric, substantially circular coils.

24. The device of claim 1, wherein said configuration of said conductive layer is patterned across the area of said diaphragm in repeating patterns.

25. The device of claim 1, wherein said configuration of said conductive layer is patterned across the area of said diaphragm in repeating sections.

26. The device of claim 1, wherein said configuration of said conductive layer is patterned to section said diaphragm into two or more segments, and wherein said segments are patterned to uniformly heat said diaphragm.

27. The device of claim 1, wherein said configuration of said conductive layer is patterned across the area of said diaphragm in a regular pattern.

28. The device of claim 1, wherein said configuration of said conductive layer is patterned across the area of said diaphragm in a serpentine progression across the area of said diaphragm.

29. The device of claim 1, wherein said configuration of said conductive layer is patterned across the area of said diaphragm in an irregular pattern.

30. The device of claim 1, wherein said configuration of said conductive layer is patterned across the area of said diaphragm in any pattern which will create uniform, or substantially uniform, heating across the area of said diaphragm.

31. The device of claim 1, wherein said shape of said diaphragm and said configuration of said conductive layer provides for said flow to be measured from any direction across the sensor irrespective of which direction said flow comes from.

32. A method for manufacturing a low power electronic sensing device for use in measuring gaseous flow, said method comprising:
providing a substrate having a first side and a second side, the substrate comprising silicon;
applying a first dielectric layer in communication with said substrate including creating an attachment layer on said first side of said substrate, said attachment layer comprising porous silicon, and applying said first dielectric layer to said attachment layer;
applying a conductive layer in communication with said first dielectric layer;
applying a second dielectric layer in communication with said first dielectric layer and said conductive layer; and
creating a cavity in said substrate in communication with said first dielectric layer to form a diaphragm.

33. The method of claim 32, wherein said substrate comprises double-side polished silicon wafer.

34. The method of claim 32, wherein said substrate comprises monocrystalline silicon.

35. The method of claim 32, wherein said first dielectric layer comprises polyimide.

36. The method of claim 32, wherein said second dielectric layer comprises polyimide.

37. The method of claim 32, further comprises creating a first preparation layer on said first side of said substrate.

38. The method of claim 37, further comprises removing said first preparation layer.

39. The method of claim 32, further comprises creating a second preparation layer on said second side of said substrate.

40. The method of claim 39, further comprises applying a photoresist layer to said second preparation layer.

41. The method of claim 40, further comprises patterning said photoresist layer.

42. The method of claim 40, further comprises removing said photoresist layer.

43. The method of claim 39, further comprises patterning said second preparation layer.

44. The method of claim 32, further comprises creating an attachment layer on said first side of said substrate.

45. The method of claim 32, further comprises a first curing of said first dielectric layer.

46. The method of claim 45, further comprises thermal heating of said first dielectric layer.

47. The method of claim 32, further comprises applying a first photoresist layer to said first dielectric layer prior to the application of said conductive layer.

48. The method of claim 47, further comprises patterning said photoresist layer prior to the application of said conductive layer.

49. The method of claim 47, further comprises removing said photoresist layer prior to the application of said second dielectric layer so as to pattern said conductive layer.

50. The method of claim 32, further comprises a curing of said second dielectric layer.

51. The method of claim 50, further comprises thermal heating of said second dielectric layer.

52. The method of claim 32, further comprises exposing portions of said conductive layer to form contact pads.

53. The method of claim 32, wherein said communication between said first dielectric layer and said substrate comprises a promoter.

54. The method of claim 32, wherein said communication between said first dielectric layer and said substrate comprises a mechanical attachment.

55. The method of claim 32, wherein said communication between said first dielectric layer and said substrate comprises a chemical attachment.

56. The method of claim 32, wherein said cavity is configured so as to have one or more ancillary structures within its space.

57. The method of claim 32, wherein said cavity is configured so as to have no structure or material within its space.

* * * * *